(12) United States Patent
Leyderman et al.

(10) Patent No.: US 6,608,205 B1
(45) Date of Patent: Aug. 19, 2003

(54) ORGANIC CRYSTALLINE FILMS FOR OPTICAL APPLICATIONS AND RELATED METHODS OF FABRICATION

(75) Inventors: Alexander Leyderman, Mayaguez, PR (US); Yunlong Cui, Mayaguez, PR (US)

(73) Assignee: University of Puerto Rico, San Juan, PR (US)

( * ) Notice: Subject to any disclaimer, the term of this patent is extended or adjusted under 35 U.S.C. 154(b) by 0 days.

(21) Appl. No.: 09/332,986

(22) Filed: Jun. 15, 1999

Related U.S. Application Data

(60) Continuation-in-part of application No. 09/033,315, filed on Mar. 2, 1998, which is a division of application No. 08/525,852, filed on Sep. 8, 1995, now Pat. No. 5,746,823.

(51) Int. Cl.$^7$ ............................................. C07D 213/72
(52) U.S. Cl. ...................... 546/304; 548/566; 564/305; 585/24
(58) Field of Search ............................. 546/304, 276.4; 564/305; 548/566; 585/24

(56) References Cited

U.S. PATENT DOCUMENTS

| | | | |
|---|---|---|---|
| 3,883,221 A | 5/1975 | Rigrod | 385/36 |
| 4,046,618 A | 9/1977 | Chaudhari et al. | 117/8 |
| 4,084,985 A | 4/1978 | Evans, Jr. | 136/251 |
| 4,227,961 A | 10/1980 | Takagi | 117/108 |
| 4,419,810 A | 12/1983 | Riseman | 438/303 |
| 4,684,434 A | 8/1987 | Thakur et al. | 117/5 |
| 4,793,893 A | 12/1988 | Thakur et al. | 117/70 |
| 4,847,053 A | 7/1989 | Pastor et al. | 117/205 |
| 5,173,446 A | 12/1992 | Asakawa et al. | 438/412 |
| 5,363,797 A | 11/1994 | Uenishi et al. | 117/68 |
| 5,385,116 A | 1/1995 | Hattori et al. | 117/5 |
| 5,746,823 A | 5/1998 | Leyderman | 117/5 |

OTHER PUBLICATIONS

A. Leyderman et al., "Electro–optical Effects in Thin Crystalline Films of Meta–Nitroaniline and 2–cyclo–octyl–amino–5–nitropyridine", *SPIE*, vol. 3474, San Diego, CA, Jul. 21, 1998, pp. 84–93.

J. Wu et al., "Pockels and Kerr Cells Fabricated With Thin Organic Crystal Films", *SPIE*, vol. 3491, pp. 694–699.

A. Leyderman et al., "Electro–Optical Characterization of a 2–Cyclo–Octylamino–5–Nitropyridine Thin Organic Crystal Film", *Optic Letters*, vol. 23, No. 12, Jun. 15, 1998, pp. 909–911.

A. Leyderman et al., "Electro–Optical Effects in Thin Single–Crystalline Organic Films Grown From The Melt", *J. Phys. D: Appl. Phys.* vol. 31, 1998, pp. 2711–2717.

K. D. Singer et al., "Measurements of Molecular Second Order Optical Susceptibilities Using dc Induced Second Harmonic Generation", *J. Chem. Phys.*, vol. 75, No. 7, Oct. 1, 1981, pp. 3572–3580.

S. Pech et al., "A New Technique for Determining the Kinetics of Crystal Growth from the Melt", *Journal of Crystal Growth*, vol. 43, No. 1, Jan.–Feb. 1978, pp. 123–125.

K. M. M. Kruse, "Apparatus and Method for the Growing of Single Crystal Specimens of Organic Substances for Infrared Spectroscopic Investigation", *Journal of Physics E: Scientific Instruments*, vol. 3, 1970, pp. 609–614.

S. K. Kurtz et al., "A Powder Technique for the Evaluation of Nonlinear Optical Materials", *Journal of Applied Physics*, vol. 39, No. 8, Jul. 6, 1968, pp. 3798–3813.

D. Stockbarger, "The Production of Large Single Crystals of Lithium Fluoride", *The Review of Scientific Instruments*, vol. 7, 1936, pp. 133–136.

P. W. Bridgman, "Certain Physical Properties of Single Crystals of Tungsten, Antimony, Bismuth, Tellurium, Cadmium, Zinc, and Tin", *Proc. Amer. Acad.*, vol. 60, 1925, pp. 303–383.

A. Leyderman, Oral Presentation at the URC–NASA conference in Huntsville, AL (Feb. 1998).

*Primary Examiner*—Amelia Owens
(74) *Attorney, Agent, or Firm*—Patent Offices of Heath W. Hoglund

(57) ABSTRACT

The present invention provides organic single crystal films of less than 20 $\mu$m, and devices and methods of making such films. The crystal films are useful in electro-optical applications and can be provided as part of an electro-optical device which provides strength, durability, and relative ease of manipulation of the mono-crystalline films during and after crystal growth.

20 Claims, 23 Drawing Sheets

Intensity of the second harmonic (SH) versus azimuthal ($\phi$, triangles) and tilting ($\theta$, circles) rotation angles. Crystal thickness is 1 μ m. E is perpendicular to n.. $\phi$max =70°, $\theta$max =5°

Intensity of the second harmonic (SH) versus azimuthal ($\phi$, triangles) and tilting ($\theta$, circles) rotation angles. Crystal thickness is 1 μ m. E is parallel to n.. $\phi_{max}$ =71°, $\theta_{max}$ =6° m-NA

Intensity of the second harmonic (SH) versus azimuthal ($\phi$, triangles) and tilting ($\theta$, circles) rotation angles. Crystal thickness is 2 μm. E is perpendicular to n.. $\phi$max =11°, $\theta$max =38°

Intensity of the second harmonic (SH) versus azimuthal ($\phi$, triangles) and tilting ($\theta$, circles) rotation angles. Crystal thickness is 2 μm. E is parallel to $n_r$. $\phi_{max}$ =13°, $\theta_{max}$ =52°

Intensity of the second harmonic (SH) versus azimuthal ($\phi$, triangles) and tilting ($\theta$, circles) rotation angles. Crystal thickness is 5 μm. E is perpendicular to $n_s$. $\phi_{max} = 66°$, $\theta_{max} = 20°$ Intensity of the second harmonic (SH) versus azimuthal ($\phi$, triangles) and tilting ($\theta$, circles) rotation angles. Crystal thickness is 5 μm. E is parallel to $n_x$. $\phi_{max} = 71°$, $\theta_{max} = 5°$ m-NA Intensity of the second harmonic (SH) versus azimuthal ($\phi$, triangles) and tilting ($\theta$, circles) rotation angles. Crystal thickness is 10 μm. E is perpendicular to $n_,$. $\phi$ max =9°, $\theta$ max =61° m-NA

Intensity of the second harmonic (SH) versus azimuthal ($\phi$, triangles) and tilting ($\theta$, circles) rotation angles. Crystal thickness is 10 μm. E is parallel to $n_r$. $\phi_{max} = 19°$, $\theta_{max} = 40°$

ORGANIC CRYSTALLINE FILMS FOR OPTICAL APPLICATIONS AND RELATED METHODS OF FABRICATION

CROSS-REFERENCE TO RELATED APPLICATIONS

The present application is a continuation-in-part of U.S. patent application Ser. No. 09/033,315, filed Mar. 2, 1998, which is a divisional of U.S. patent application Ser. No. 08/525,852, filed Sep. 8, 1995, now U.S. Pat. No. 5,746,823, the disclosures of which are hereby incorporated by reference in their entirety.

The invention described herein was made with government support under Grant No. F496209710256 by US AFSOR and Grant No. NAG8-1344 awarded by NASA-OMU. The U.S. government might have certain rights to this invention.

BACKGROUND OF THE INVENTION

1. Field of the Invention

The present invention relates to organic crystals and crystalline films, and more particularly to organic monocrystalline films.

2. Description of Related Art

Electro-optic devices, such as light modulators and shutters, have been widely applied in many areas. However, the devices that are available on the market are made from inorganic crystals. Generally speaking, these devices are not only relatively expensive and bulky, but also have a slow response time and need higher driving voltages.

Organic electro-optic materials based on extended π-electron systems have been proposed for electro-optic applications, especially in the area of fast opto-electronics, because of their large electro-optic coefficients and fast response time. For example, the electro-optic coefficient $r_{11}$ of 2-methyl-4-nitroaniline (MNA) is about twice as large as the electro-optic coefficient $r_{33}$ of $LiNbO_3$, and the response time of MNA is expected to be 100 times faster than that of $LiNbO_3$ at 633 nm (Lipscome et al., *J. Chem. Phys* 74:1509, 1981; Garito et al. *Laser Focus* 18:59, 1982). Other crystals, such as styrylpyridinium cyanine dye (SPCD), 4-N,N-dimethylamino-4'-N'methyl-stilbazolium tosylate (DAST), and N-(4-nitrophenyl)-L-prolinol (NPP) have been reported to have very large electro-optic coefficients. However, a good organic crystal, in addition to having a fast response time and a large electro-optic coefficient, should also possess adequate chemical, thermal, and mechanical stability.

Generally speaking, organic electro-optic materials are available in the form of small flakes, which have the reputation of being fragile when subjected to mechanical, thermal, or chemical attack. Moreover, molecular crystals are fragile, since the interactions among the molecules are very weak.

Films of organic crystalline materials can be used in various optical applications. For example, optical waveguides made from organic material include slab waveguides in which light is confined in only one dimension, and 2-D channels of size 1 cm×1 µm×1 µm. In addition, cylindrical geometry devices filled inside and outside by a non-linear material and surrounded by an electrical field have been reported.

The growth of thin single crystals is discussed, for example, in the reference by K. M. M. Kruse entitled "Apparatus and Method For The Growing Of Single Crystal Specimens Of Organic Substances For Infrared Spectroscopic Investigation," J. of Physics E: Scientific Instr., vol. 3, pp. 609–14, 1970, Great Britain. The crystals are grown from the melt between NaCl (or KBr) windows held at a distance of about 25 µm apart by means of a thin spacer (Polyester foil). A temperature gradient is maintained first along a capillary and then along the largest dimension on the NaCl windows, resulting in a clear definition of the crystallizing zone. The crystallizing zone is slowly raised by lowering the cell along the vertical temperature gradient within a heated column.

A second reference by Pech et al. studies the growth of solid benzophenone from its own melt contained in a crucible submitted to a unidirectional temperature gradient. (Pech et al., "A New Technique For Determining The Kinetics Of Crystal Growth From The Melt," J. of Crystal Growth, vol. 43, no. 1, 123–25, 1978.) In this reference, a sample was placed in a 1×10×15 mm$^3$ crucible made of glass plates. Thermal boundary conditions were imposed by two heating blocks fixed to the extremities of the crucible and connected to thermostats. The crucible is fixed to the substage of a microscope so that the moving liquid-solid interface can be maintained in coincidence with the crosshair reticule of the objective of the microscope.

Another method for producing a crystal film is discussed in U.S. Pat. No. 5,385,116 to Hattori et al., entitled "Method For Producing Organic Crystal Film". In this patent, a crystal film on an organic compound is produced from a molten liquid between a pair of substrates. At least one of the pair of substrates has on a part of a surface thereof a three-dimensional geometrical structure capable of controlling the direction of crystal growth of the organic compound. The other part of the surface having the three-dimensional geometrical structure is smooth.

U.S. Pat. No. 4,793,893 to Thakur et al., entitled "Methods For The Preparation Of Thin Large-Area Single Crystals Of Diacetylenes And Polydiacetylenes", discusses a method for preparing thin large-area single crystals of diacetylene monomer. This method involves forming a liquid layer containing pure diacetylene monomer between two opposed surfaces; applying pressure to the liquid layer disposed between the two opposed surfaces; and crystallizing the liquid layer disposed between the two opposed surfaces while, by evaporation, the liquid layer is kept under constant pressure to form a thin large-area single crystal of pure diacetylene monomer. This patent also discusses a method for preparing a thin large-area single crystal of pure diacetylene monomer.

Notwithstanding the above mentioned references, there continues to exist a need in the art for improved structures including organic crystals and related methods for forming organic crystals. Such structures can provide organic crystals and crystalline films with superior optical properties.

SUMMARY OF THE INVENTION

In view of the foregoing background, it is an object of the present invention to provide improved methods and structures for organic crystalline films. These methods and structures can be used to create organic crystals and organic crystalline films with superior optical properties that can be used in electro-optical devices. The organic crystals according to the present invention have faster response times and use smaller driving voltages than currently-available inorganic crystals. These crystals are also mechanically, thermally, and/or chemically stronger than currently available organic materials.

This and other objects, features, and advantages according to the present invention are achieved by providing a device for manufacturing organic crystal films that protects the fragile crystals. The device can also be used directly as an electro-optical device and can comprise a first plate having a first face. The first face defines a recess which is filled with a material which can be crystallized, and covered with a second plate having a second face. Accordingly, the second face is in contact with the first face and the material in the recess is completely enclosed by the first and second plates. The material within the recess is thereby protected by the plates from chemical and mechanical damage as well as evaporation.

The material in the recess can be crystallized, and the step of crystallization can include the steps of heating the material above a melting temperature, and cooling the material to obtain a homogeneous distribution. The crystallization step can be used to produce a single crystal film of the material in the recess. The single crystal film can provide optical properties that are superior to those of polycrystalline films. In addition, the material can be an organic compound which has non-linear optical properties.

The plates used to contain the material are preferably transparent allowing the material to be visually monitored during the crystallization step. For example, the plates can be formed of fused quartz, which is preferably optically polished to reduce the formation of defects during the crystallization step.

Furthermore, the first face of the first plate preferably defines a groove surrounding the recess. This groove can then be used to contain a portion of the material. For example, if the recess is initially overfilled, or if the material overflows from the recess as a result of thermal expansion, the excess can be contained by the groove. Accordingly, any excess material will be prevented from separating the two plates.

In another embodiment of the present invention, an optical device includes a first plate having a first face which defines a recess, a crystalline material in the recess, and a second plate having a second face wherein the second face covers the first face and crystalline material in the recess. The first face of the first plate may further define a groove surrounding the recess, and a portion of the crystalline material may be contained in the groove surrounding the recess.

The first and second plates are preferably first and second transparent plates such as first and second fused quartz plates. In addition, the second face of the second plate and a surface of the recess opposite the second plate are preferably optically polished. The crystalline material may be an organic compound, and it is preferably a single crystal film.

The methods and structures of the present invention provide an organic single crystal thin film which can be used in non-linear optical applications. The structure can be reproducibly fabricated with relatively little expense. In addition, the thin film in the recess is protected from chemical and mechanical damage, as well as evaporation, by the two plates.

DETAILED DESCRIPTION OF PREFERRED EMBODIMENTS

Figure 1:
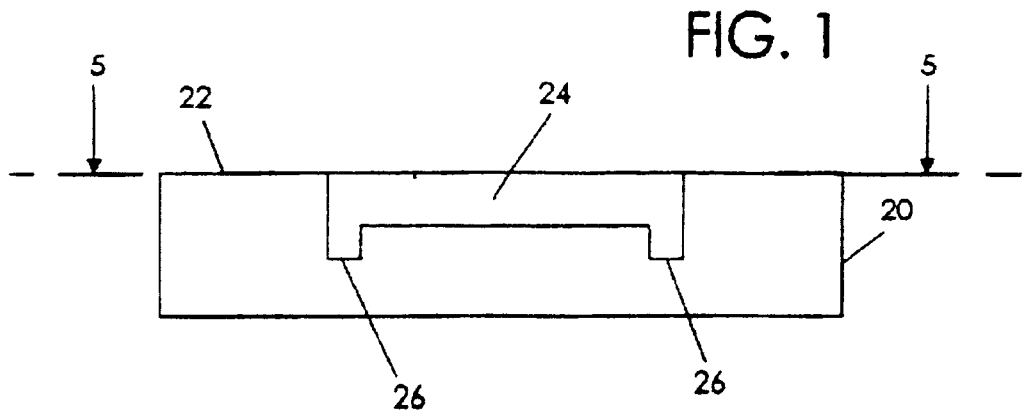
FIGS. 1–4 show cross-sectional views of various steps in the fabrication of a thin crystalline film according to a method of the present invention.

The present invention will now be described more fully hereinafter with reference to the accompanying drawings, in which preferred embodiments of the present invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art. In the drawings, the thickness of the layers and regions are exaggerated for clarity. Like numbers refer to like elements throughout and prime notation is used to indicate like elements in various embodiments.

In a first aspect of the present invention, an organic crystal and an organic crystalline film are provided. The organic crystal can comprise any organic material or materials, but preferably comprises those organic materials with suitable optical properties. In highly preferred embodiments, the organic materials are those that show, upon crystallization, superior efficiency in electro-optical applications. Examples of such organic materials include, but are not limited to, meta-nitroaniline (m-NA), 2-methyl-4-nitroaniline (MNA), (−)2-(alpha-methylbenzylamino)-5-nitropyridine (MBANP), N-(4-nitrophenyl)-L-prolinol (NPP), benzyl, 2-cyclo-octylamino-5-nitropyridine (COANP), 2-[N-prolinol]-5-nitropyridine (PNP), and 2-adamanlylamino-5-nitropyridine. Preferably, it should be feasible to grow crystals of the organic material from melt.

The crystalline film is a very thin film. In preferred embodiments, the film is preferably less than 20 $\mu$m thick, and more preferably no more than 10 $\mu$m thick. More preferably, the film is 10 $\mu$m thick or less, for example, approximately 5 $\mu$m thick, or approximately 3 $\mu$m thick. In highly preferred embodiments, the crystalline film is less than 3 $\mu$m thick.

It is preferable that the organic crystalline films are formed from single crystals. While polycrystalline films can be used in electro-optical applications and are included within the present invention, it has been observed that single-crystal films, i.e., mono-crystalline films, provide superior electro-optical characteristics. It is preferable that an organic crystal or an organic crystalline film according to the invention have a figure of merit of electro-optic phase retardation between approximately $1 \times 10^{-12}$ m/V and approximately $9.9 \times 10^{-12}$. More preferably, the figure of merit of electro-optic phase retardation is between approximately $1.6 \times 10^{-12}$ m/V and approximately $5.6 \times 10^{-12}$ m/V. Most preferably, the figure of merit of phase retardation is between approximately $3.2 \times 10^{-12}$ m/V approximately and $4.2 \times 10^{-12}$ m/V.

In one embodiment of the present invention, the organic crystal or organic crystalline film comprises meta-nitroaniline (m-NA) and has a figure of merit of electro-optic phase retardation between approximately $1.6 \times 10^{-12}$ m/V and approximately $5.6 \times 10^{-12}$ m/V, most preferably approximately $3.2 \times 10^{-12}$ m/V. In another embodiment of the present invention, the organic crystal or organic crystalline film comprises 2-cyclo-octylamino-5-nitropyridine (COANP) and has a figure of merit of electro-optical phase retardation between approximately $3.7 \times 10^{-12}$ m/V and $4.7 \times 10^{-12}$ m/V, most preferably approximately $4.2 \times 10^{-12}$ m/V.

Figure 3:
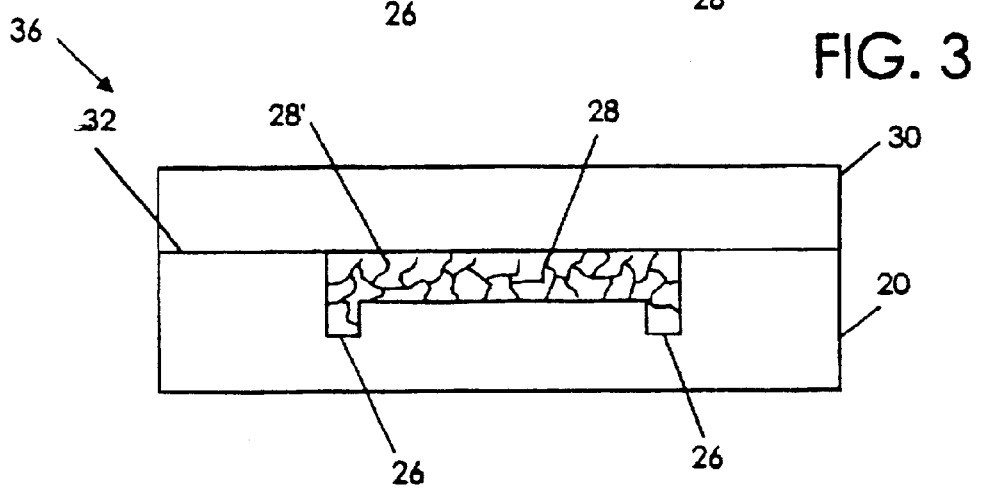
Figure 4:
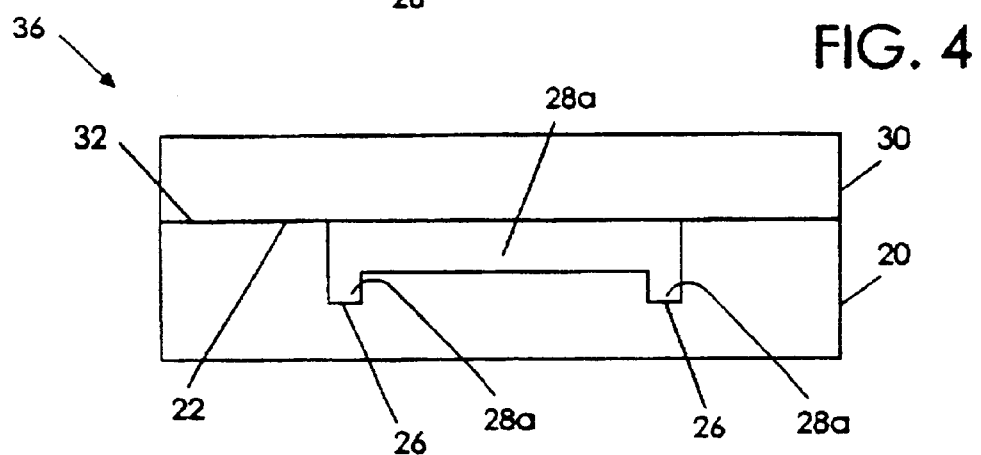
Figure 5:
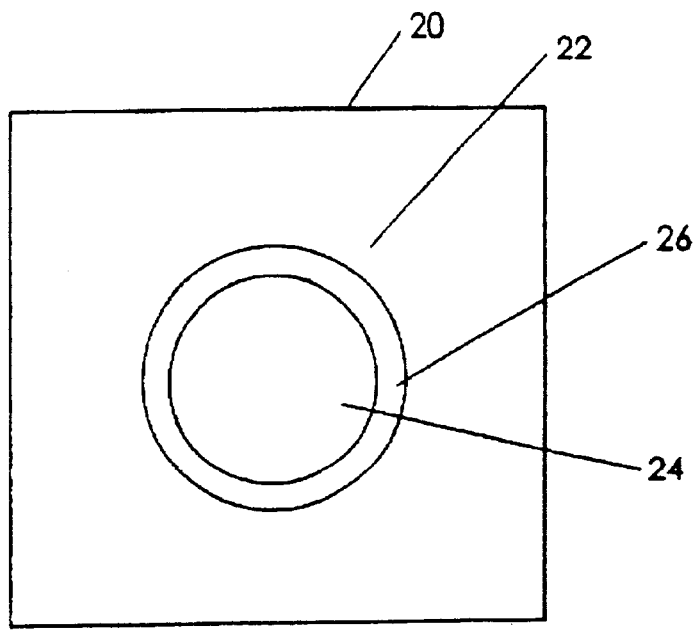
FIG. 5 shows a top view of a plate including a recess and a grove according to FIG. 1.

In another aspect of the present invention, the organic crystalline film according to the present invention can be fabricated by a method illustrated in FIGS. 1–4 and 5. In this method, a thin crystalline film is grown between two plates. As shown in FIGS. 1 and 5, a first plate 20 has a first face 22, and the first face defines a recess 24. The recess 24 can be on the order of 10 mm in diameter, and anywhere from 0.5 to 500 micrometers deep. The first face may also define a groove 26. As shown in FIG. 5, the recess and groove are both circular. As will be understood by those having skill in the art, however, the recess and groove may have other shapes such as oval, oblong, square, etc.

Figure 2:
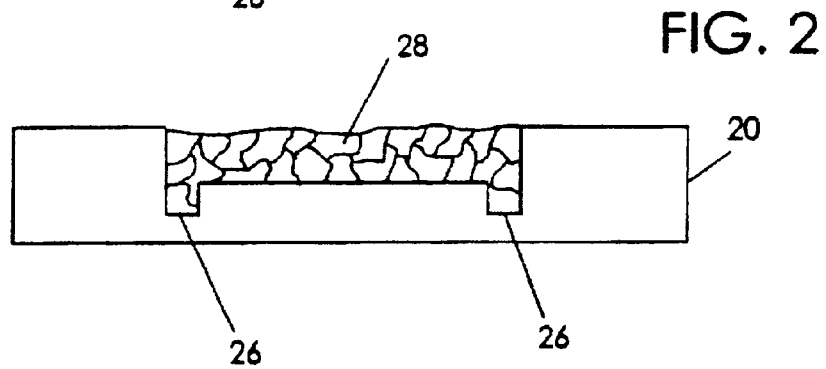

As shown in FIG. 2, the recess is filled with a material 28 such as meta-nitroaniline (m-NA), 2-methyl-4-nitroaniline (MNA), (−)2-(alpha-methylbenzylamino)-5-nitropyridine (MBANP), N-(4-nitrophenyl)-(L)prolinol (NPP), benzyl, 2-cyclo-octylamino-5-nitropyridine (COANP), 2-[N-prolinol]-5-nitropyridine (PNP), and 2-adamanlylamino-5-nitropyridine, or other compounds known to those having skill in the art which can be crystallized by heating the material to obtain a homogeneous distribution and then cooling the material. Other organic materials are disclosed for example in the following references: K. M. M. Kruse, "Apparatus and Method for the Growing of Single Crystal Specimens of Organic Substances for Infrared Spectroscopic Investigation," J. of Physics E: Scientific Instr., vol. 3, pp. 609–14, 1970 (Great Britain); Pech et al., "A New Technique for Determining the Kinetics of Crystal from the Melt," J. of Crystal Growth, vol. 43, no. 1, pp. 123–25, (1978); U.S. Pat. No. 5,385,116 to Hattori et al. entitled "Method for Producing Organic Crystal Film"; and U.S. Pat. No. 4,793,893 to Thakur et al. entitled "Methods for the Preparation of Thin Large-Area Single Crystals of Polydiacetylenes". Each of these references is hereby incorporated herein in its entirety by reference.

The first face 22 of the first plate 20 and the recess 24 are then covered by a second plate 30 so that the second face 32 of the second plate 30 is in contact with the first face 22 of the first plate 22. Accordingly, the second plate 30 acts as a lid, enclosing the material 28 within the recess 24 as shown in FIG. 3. The material 28 is preferably a thin polycrystalline film at this point. The material can be heated above its melting point and then cooled in order to form a thin polycrystalline film with a homogeneous distribution. As shown, this film may contain a plurality of crystal grains, including the single crystal grain 28′, divided by grain boundaries.

The plates are both preferably transparent, so that the material 28 can be visually monitored during the various steps of the fabrication of the single crystal film. For example, the two plates can be fused quartz plates. In addition, the plates are optically polished allowing the two plates to fit closely together and also to avoid the formation of seeds during the crystallization step.

The material is then re-crystallized to form a single crystal thin film 28a of the material, which is completely enclosed within in the recess 24 between the two plates, as shown in FIG. 4. The material 28 can be crystallized by heating above the melting point of the material (112° C. for m-NA) and then slowly cooling the material so that a single crystal film forms from a single crystal grain. For example, the material 28 can be completely melted except for the single crystal grain 28′. When the material is slowly cooled, a single crystal thin film 28a grows from the single crystal grain 28′.

The groove 26 surrounding the recess 24 can be used to contain an excess portion 28b of the material which overflows from the recess 24. For example, the overflow may be caused by initially overfilling the recess or as a result of heating the material thereby resulting in thermal expansion of the material. By providing a groove 26 where excess portions 28b of the material can accumulate, the excess material is prevented from remaining between the faces of the two plates. Accordingly, the two plates can be maintained in direct contact without being separated by excess portions of the material. The faces of the two plates form a tight seal protecting the material within the recess from chemical or mechanical damage as well as from evaporation.

Figure 6:
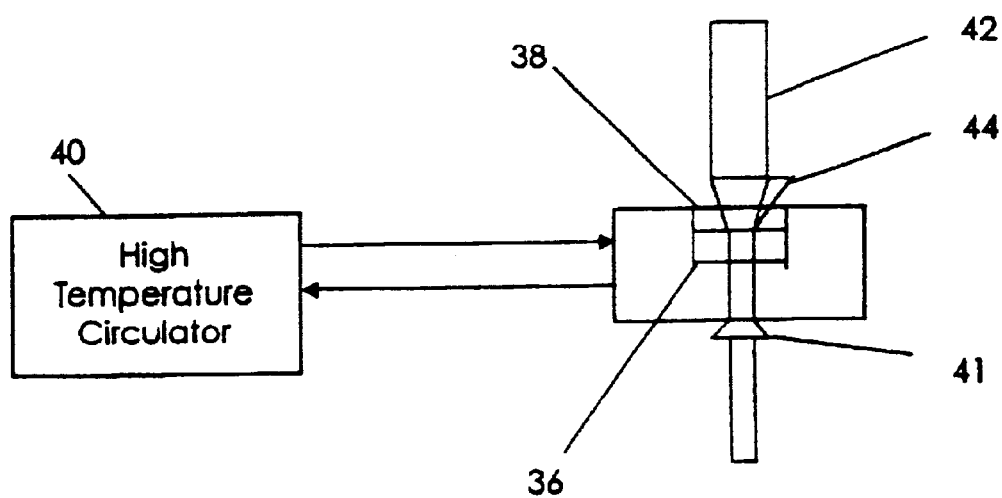
FIG. 6 shows an experimental set up according to the present invention.

The two plate structure of FIGS. 3 and 4 defines a cell 36 which can be incorporated in the crystal-growth setup of FIG. 6. The cell 36 is positioned in a heat exchange chamber 38 in which a desired temperature is achieved by pumping a liquid heat carrier from a high temperature circulator 40 with a temperature controller. The heat exchange chamber can be brass, and the temperature circulator can be a commercially available temperature circulator such as a Neslab EX-250HT high temperature controller. The liquid heat carrier can be distilled water for growing crystals with melting points below 100° C., or a commercially available liquid such as Syntherm 800 liquid having a boiling point higher than that of water, for growing crystals with melting points above 100° C. The heat exchange chamber 38 and the cell 36 can be placed on the stage 41 of a polarizing microscope 42 for observation and control of single crystal growth. The stage preferably has three degrees of freedom of motion, allowing observation of different regions of the crystal during crystal growth.

In one embodiment of the method of making a crystalline film according to the present invention, the organic material in the recess formed by the plates of the cell is heated and then cooled to obtain a homogeneous distribution as shown in FIG. 3. The cell 36 is then placed in the heat exchange chamber 38 as shown in FIG. 6, and a single crystal grain 28' having a desired crystallographic orientation is visually located using the microscope 42. The temperature of the cell 36 is then increased by pumping the liquid heat carrier through the heat exchange chamber 38 in order to melt the material 28. The single crystal grain 28', however, is maintained in its crystalline form by specifically cooling that grain. This localized cooling can be achieved by using a microjet 44 to blow cool air onto the cell 36 at the location of the single crystal grain. The melted material is then slowly cooled so that the single crystal acts as a seed. Accordingly, the material forms a single crystal film having the same crystallographic orientation as the single crystal grain. While the use of a microjet is disclosed as a means for providing a single crystal grain as a seed for crystal growth, other techniques for providing a seed will be known to those having skill in the art.

In a highly preferred embodiment, the method of making an organic monocrystalline film comprises the following steps:
    a) providing a cell comprising a first and a second plate, wherein said first plate defines a recess, and wherein said first plate and said second plate are positioned parallel to each other such that said recess is completely enclosed by said first and second plates,
    b) filling said recess of said cell with a material that can be crystallized comprising an organic compound,
    c) heating said cell to a temperature sufficient to melt said organic compound,
    d) cooling said cell to obtain a homogeneous distribution of crystal grains,
    e) reheating said cell to a temperature sufficient to melt said crystal grains while maintaining a single crystal grain at a temperature below the melting temperature of the crystal,
    f) cooling said cell to form a crystalline film, and
    g) optionally, repeating steps e) and f) until a monocrystalline film of desired size is produced.

The thus-grown crystal or crystalline film is packed between the two plates preventing its evaporation and mechanical damage. In addition, the microscope allows the crystallization method to be performed manually. Alternately, the method can be automated by using a CCD camera and a computer as will be understood by those having skill in the art.

Crystals have developed sliding systems. The highest rate of crystal growth takes place along the highest density of molecular packing (HDMP) in the cleavage plane. In most crystals having symmetries higher than triclinic, the cleavage plane is typically parallel to the crystallographic plane formed by the smallest parameters, and the direction of growth is parallel to the shortest axis ofthe lattice cell. In the case of m-NA, the cleavage plane will be the (010) plane, and the direction of growth will be the [001] direction.

When the temperature is decreased from near the melting point of the material to the ambient temperature, the crystal packed in the recess between the two plates of the cell experiences strain due to the difference in coefficients of temperature expansion of the crystal and the plates. If the crystal has a thickness greater than 3 micrometers, microscopic cracks may form. The direction of these cracks is collinear with the highest density of molecular packing, and the density of the cracks may be correlated with the thickness of the crystal. In some crystals with thicknesses greater than 10 micrometers, an additional system of more fine and less rectilinear cracks may form in the direction perpendicular to the highest density of molecular packing. Crystalline films with a thickness of less than 1 $\mu$m have been foimd to have no cracks due to the higher withstanding strain.

The method of forming an organic crystalline film of the present invention provides a number of advantages. Single crystal films of, for example, m-NA with low concentrations of defects can be formed having a surface area of up to 1 cm$^2$ and thicknesses ranging from 0.5 to 500 microns. By forming crystals with a thickness of less than 3 microns, defects can be reduced, and in particular, the concentration of dislocations can be reduced. These single crystal films have a higher non-linear efficiency performance than that of polycrystalline films. In addition, the geometry of these single crystal films allows either diffraction and/or plane mode elements to be formed. The geometry of these films also allows the Cerenkov conditions for second harmonic generation to be achieved.

The use of the two plate structure including a recess and a groove, protects the single crystal film in the recess from mechanical and chemical damage. The crystal orientation of the film can be readily determined using interference techniques. Furthermore, the structure including the single crystal film in a recess between two plates combines the advantages of a crystalline structure, such as the phase matching condition which increases the efficiency of second harmonic generation, with that of optical waveguides. Accordingly, the number of modes generated can be limited for optical switching applications such as for optical computers and imaging.

In addition, because the present crystalline films are very thin, changes in temperature of the films can lead to deformation without destroying the film or causing defects. This is especially true of films less than 3 microns thick. These deformations can change the refractive indices. In particular, lower electronic transitions, such as exciton bands, can be changed as a result of changing the temperature, thereby changing the optical properties of the crystal. This property effectively widens the optical applications of these crystalline films. The method of forming crystals of the present invention can thus provide the ability to control the electro-optical characteristics of the crystalline films produced according to the invention, and can also be used to screen a wide variety of organic compounds for non-linear optical applications.

EXAMPLES

The invention will be further clarified by the following Examples, which are intended to be purely exemplary of the invention, and should not be construed as limiting the invention in any way.

Example 1

Preparation of m-NA Crystalline Film

The material 28 used to form the thin single crystal film 28a can be an organic material such as m-NA. Orthorhombic m-NA [(NO$_2$)C$_6$ H$_4$ (NH$_2$)] belongs to the space group Pbc2$_1$ (point group mm 2), with Z=4, and lattice parameters a=6.501 Angstroms, b=19.33 Angstroms, and c=5.082 Angstroms. Various properties of m-NA are given below in Table 1.

TABLE 1

| Name | 3-nitroaniline | | |
|---|---|---|---|
| (Abbreviation) | (m-NA) | | |
| Chemical Formula | O$_2$NC$_6$H$_4$NH$_2$ | | |
| mp. ° C. | 112 | | |
| Symmetry | Pbc2$_1$, | C$_{2v}^5$ | |
| Parameters of cell, Å | a = 6.501 | b = 19.33 | c = 5.082 |
| Gliding System | (010), | [001] | |
| Refraction indices* | | | |
| 1064 nm | n$_1$ = 1.74 | n$_2$ = 1.71 | n$_3$ = 1.65 |
| 532 nm | n$_1$ = 1.81 | n$_2$ = 1.79 | n$_3$ = 1.72 |

The strongest intermolecular interaction takes place in the (010) plane along the direction of the c-axis. Besides van der Waals interactions, hydrogen bonding (O . . . H—N and N . . . H—N) contributes to the crystal energy. Both types of interactions are responsible for a double-layer structure which is perpendicular to the crystallographic [010] axis. Observations reveal that m-NA is unstable and oxidizes at its melting point. Re-crystallization of the m-NA by the methods of the present invention does not significantly shift the edge of absorption. At the first stage of growth from a seed, the crystal had an arrow like shape with a longer side aligned perpendicular to the larger index of refraction in the plane of the crystal refraction index. For the m-NA crystal, this is also the largest refraction index of the crystal.

Figure 7:
FIG. 7 shows a crystal in polarized light according to the present invention.

By maintaining a single crystal grain of the m-NA as a crystal growth seed by localized cooling, such as by a microjet as discussed above, while melting the rest of the m-NA and then slowly cooling the m-NA, the seed will orient along the temperature gradient. As the crystal seed grows, the formation of spikes of crystal growth, which can result in twin defects, is avoided by slowly lowering the rate of growth while observing the crystal growth. If defects are observed, the temperature can be raised to remelt the defect and then lowered to continue crystal growth. Despite the high asymmetry of growth rates, large-area high quality crystalline films can be grown. FIG. 7 shows a photograph of a m-NA crystalline film in cross-polarized light. This film is about 10 microns thick.

According to various studies, m-NA is a negative biaxial crystal. Refraction indices of m-NA for wavelengths of 1,064 nm and its harmonic 0.532 nm are given in Table 1 above. m-NA belongs to class 13 of Hobden's classification, and phase matching conditions are observed in the cone of directions about the optic axis only for processes involving fundamental waves of parallel polarization (type I).

Example 2

Detection of Optical Properties

Figure 8:
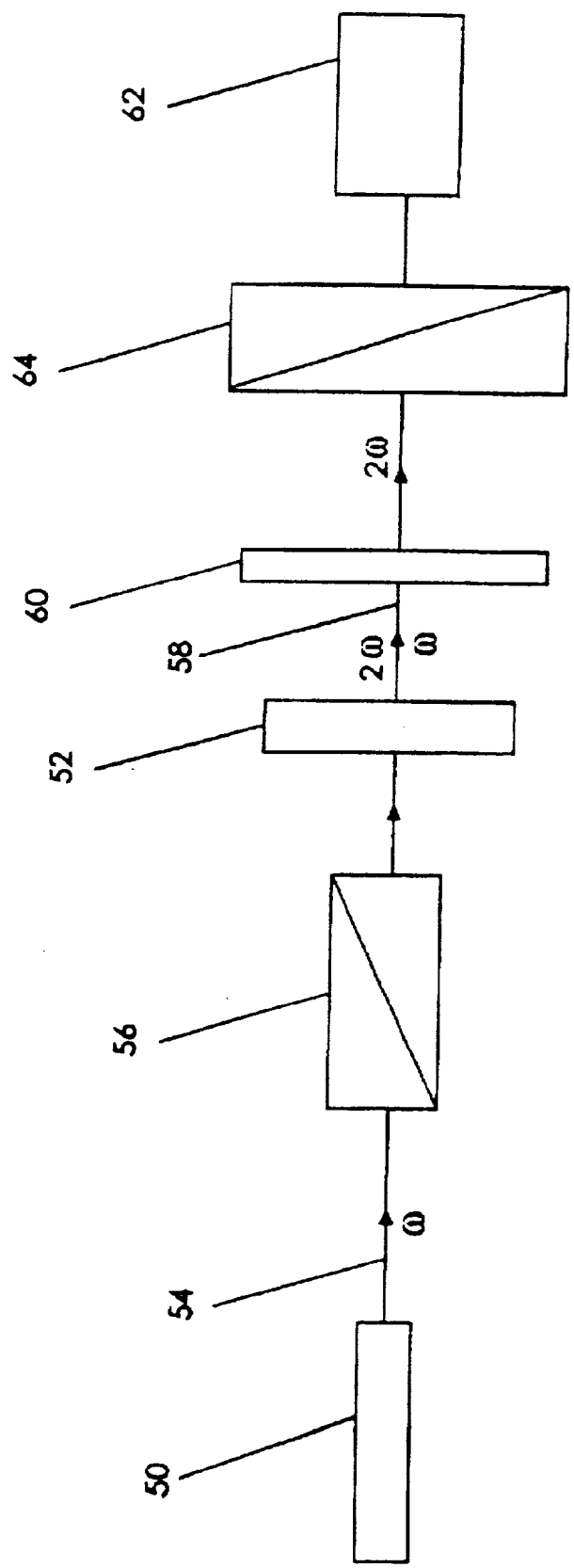
FIG. 8 shows a set up for measuring the second harmonic generation of crystalline films according to the present invention.

FIG. 8 shows a schematic diagram of an experimental setup for second harmonic generation measurements. A 1064 nm wavelength laser 50 such as a Quantel Q-switched Nd:YAG laser (1064 nm) with a 10 HZ pulse repetition rate can be used as a fundamental source. The intensity of the fundamental beam can be on the order of 100 mW/cm$^2$. The crystal 52 can be preliminarily oriented using the polarizing microscope (illustrated in FIG. 6), and placed onto a goniometer head with its plane perpendicular to the incident beam 54. The polarization plane of the incident beam can be rotated by a double-Fresnel rhomb 56, and set either parallel or perpendicular to the c-axis of the crystal 52. The output radiation beam 58 from the crystal can be filtered through filter 60 to eliminate the fundamental 1,064 μm radiation. The generated second harmonic can be detected by a detecting system 62 which may include a lens to focus the second harmonic and a diode detector such as a Hamamatsu S1337-BQ series diode detector. The averaged signal generated by the detecting system 62 can be observed and measured by an oscilloscope such as a Tektronix model 7704 oscilloscope. The experimental setup can also include a polarizer 64 to analyze the generated second harmonic.

A crystal can be initially positioned on the stage of a microscope with the n$_\beta$ axis horizontal, and the n$_\tau$ axis vertical. Rotating the crystal along the vertical axis, the orientation resulting in the maximum intensity of the second harmonic can be found thus defining the direction of matching conditions. The intensity of the second harmonic can be measured versus azimuthal rotation angle (along the n$_\beta$ axis) and tilting angle (around the n$_\tau$ axis).

The intensity of the second harmonic can be determined mathematically by the following equation:

$$I^{2\infty} = \{2\infty^2/[_oC^3(n^\infty)^2n^{2\infty}]\}d^2L^2(I^\infty)^2 \sin c^2(\Delta KL/2)$$

In this equation, L is the thickness of the film, d is the effective non-linear susceptibility, sin c(x)=(sin x)/x, and x=(ΔKL/2) is the phase mismatch between the fundamental and second harmonic waves.

In order to measure the intensity of the second harmonic, the 1064 nm radiation of the laser 50 of FIG. 8 is vertically polarized, and the power of the laser is reduced to a value on the order of 2.5 mW to prevent damage to the crystal. The polarization and intensity of the second harmonic generated by thin crystalline films of m-NA versus the angle of rotation along the vertical and horizontal axes can be measured.

Figure 15:
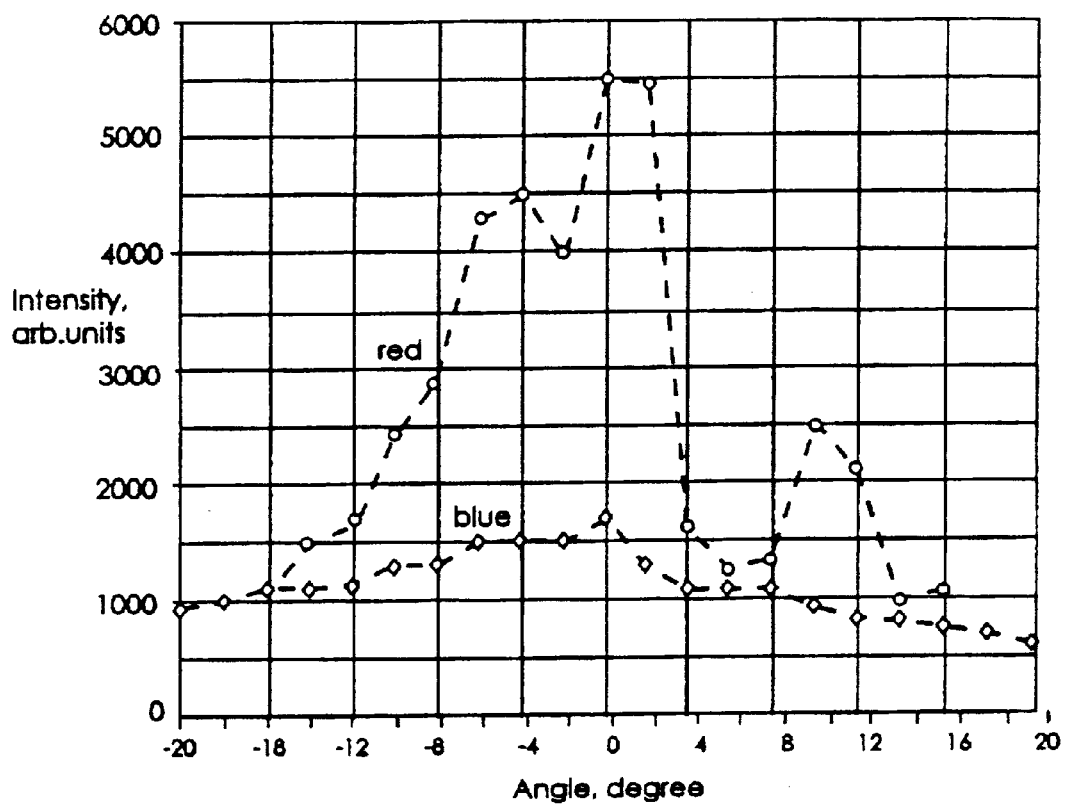
FIG. 15 shows the intensity of the second harmonic versus azimuthal ($\phi$, triangles) and tilting ($\theta$., circles) rotation angles. Crystal thickness is 10 $\mu$m. E is perpendicular to $n_\gamma$. $\phi_{max}=90°$, $\theta_{max}=61°$.
Figure 16:
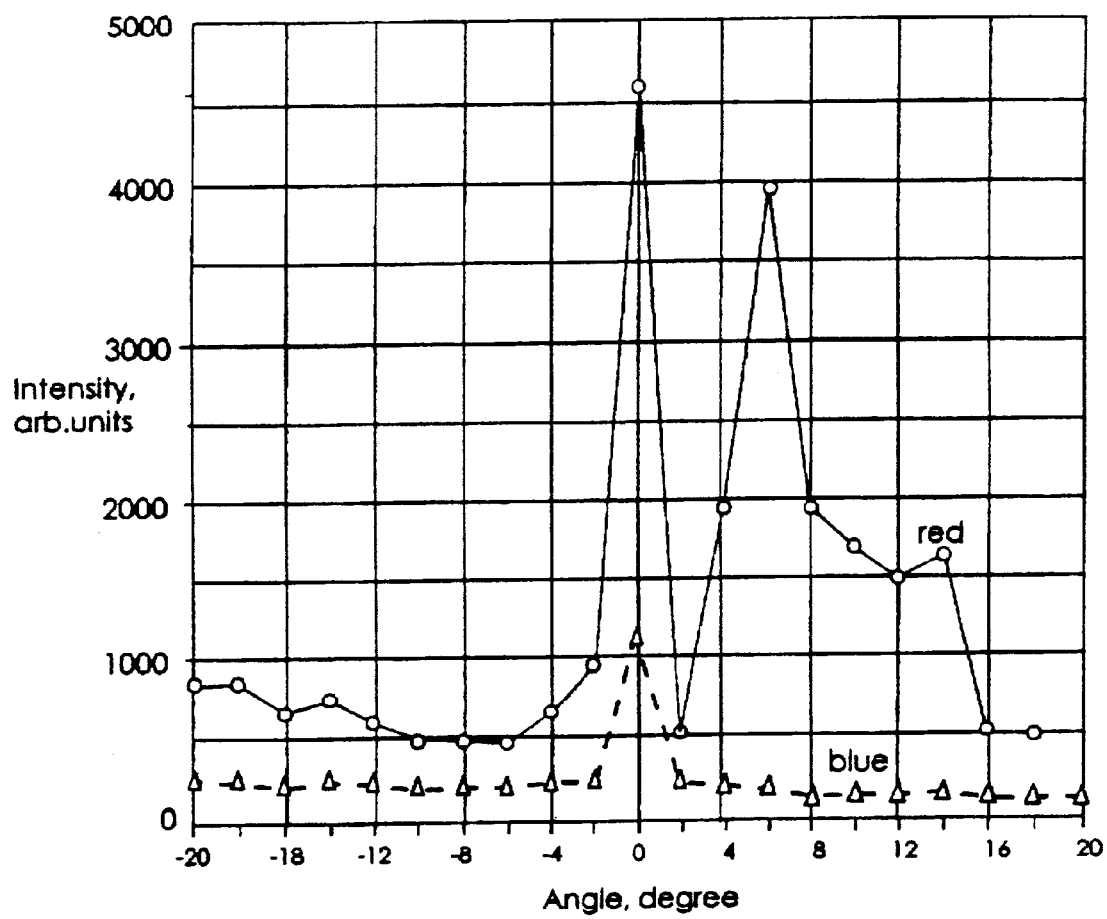
FIG. 16 shows the intensity of the second harmonic versus azimuthal ($\phi$, triangles) and tilting ($\theta$., circles) rotation angles. Crystal thickness is 10 $\mu$m. E is perpendicular to $n_\gamma$. $\phi_{max}=19°$, $\theta_{max}=40°$.
Figure 17:
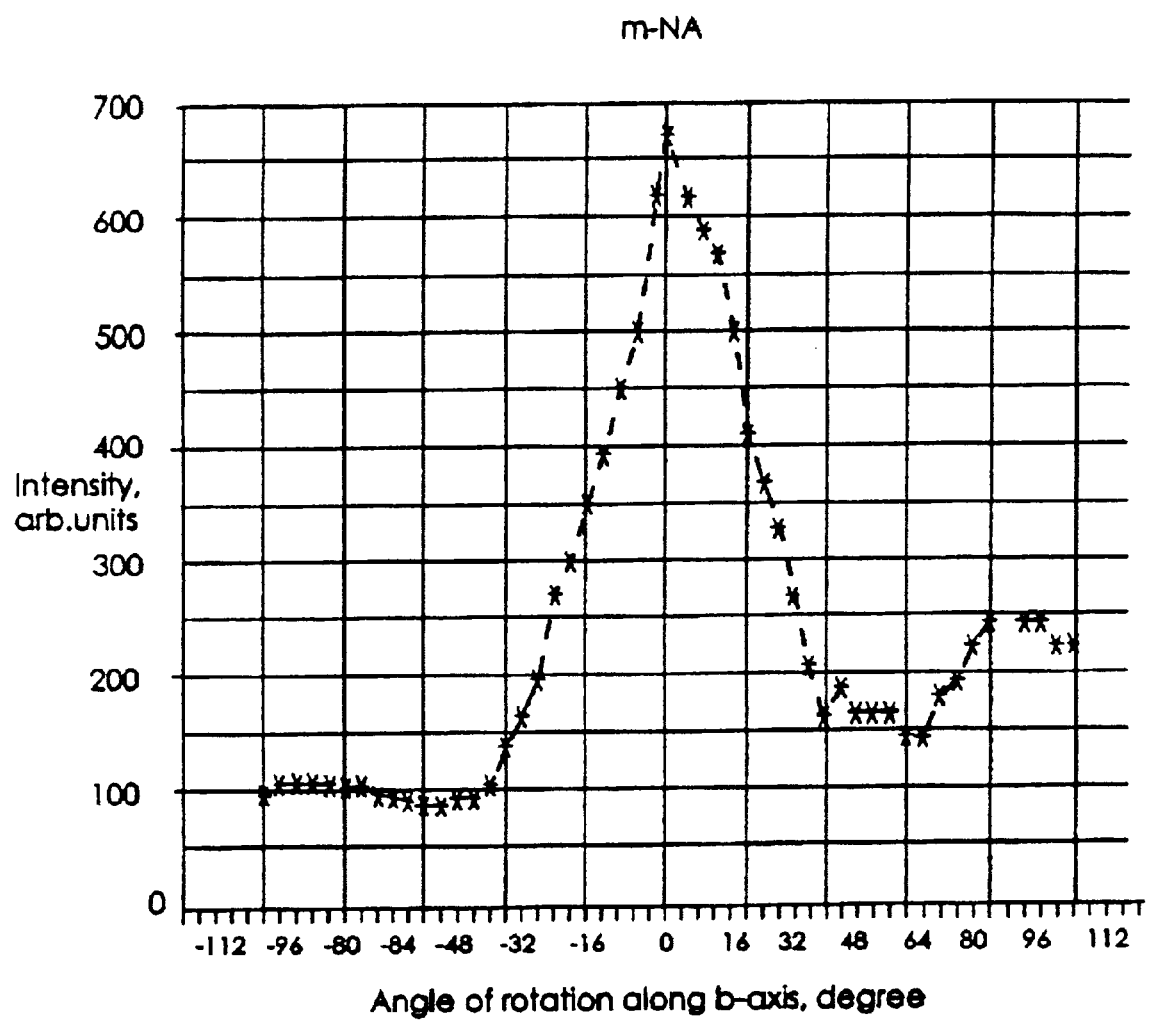
FIG. 17 shows the intensity of the second harmonic versus rotation angle along b-axis (parallel to $n_\alpha$). Crystal thickness=10 $\mu$m.

These measurements were made and the resulting data is graphically illustrated in FIGS. 7–17. In the graphs of FIGS. 9–16, the horizontal axis represents the angle in units of degrees, and the vertical axis represents the intensity of the second harmonic in arbitrary units. In FIG. 17, the horizontal axis represents the angle of rotation along the b-axis in degrees, and the vertical axis represents the intensity of the second harmonic in arbitrary units.

Figure 9:
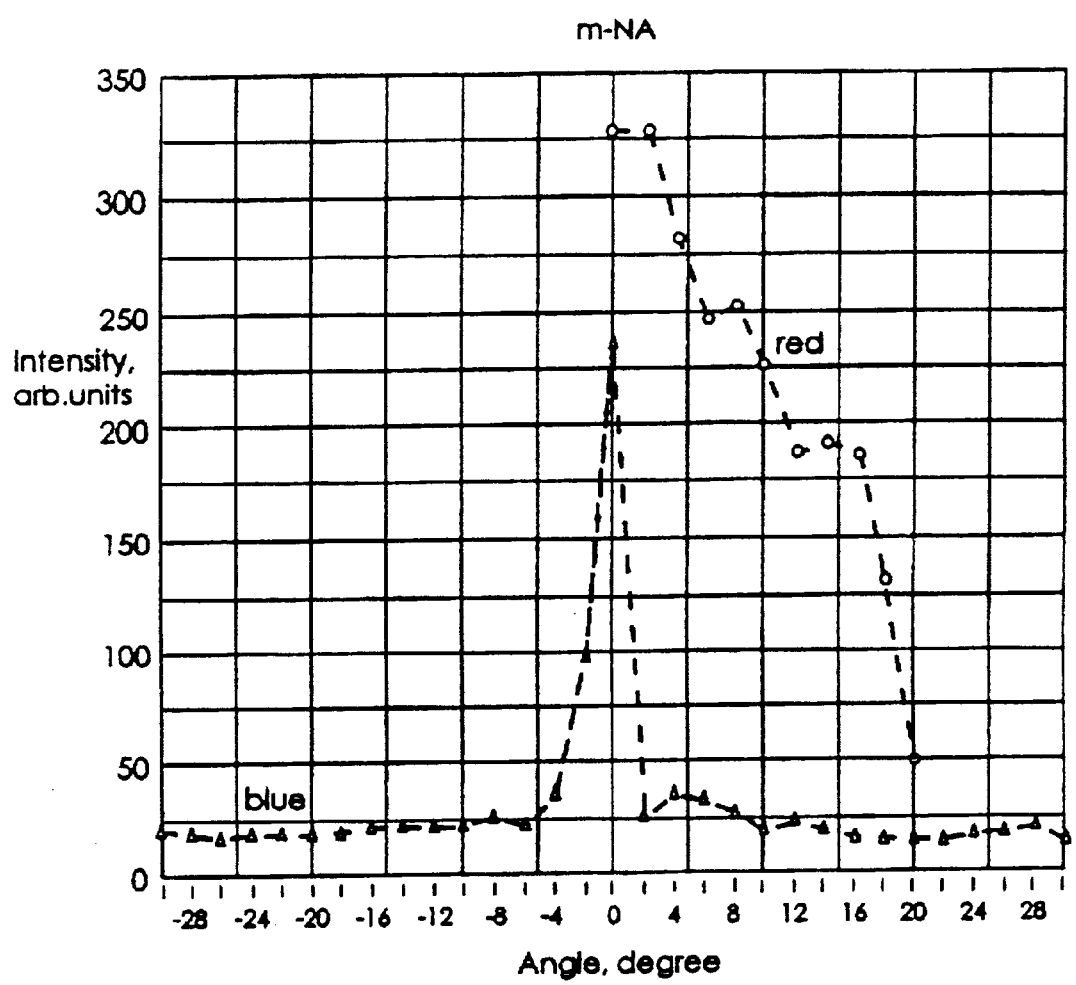
FIG. 9 shows the intensity of the second harmonic versus azimuthal ($\phi$, triangles) and tilting ($\theta$, circles) rotation angles. Crystal thickness is 1 $\mu$m. E is perpendicular to $n_\gamma$. $\phi_{max}=70°$, $\theta_{max}=5°$.
Figure 10:
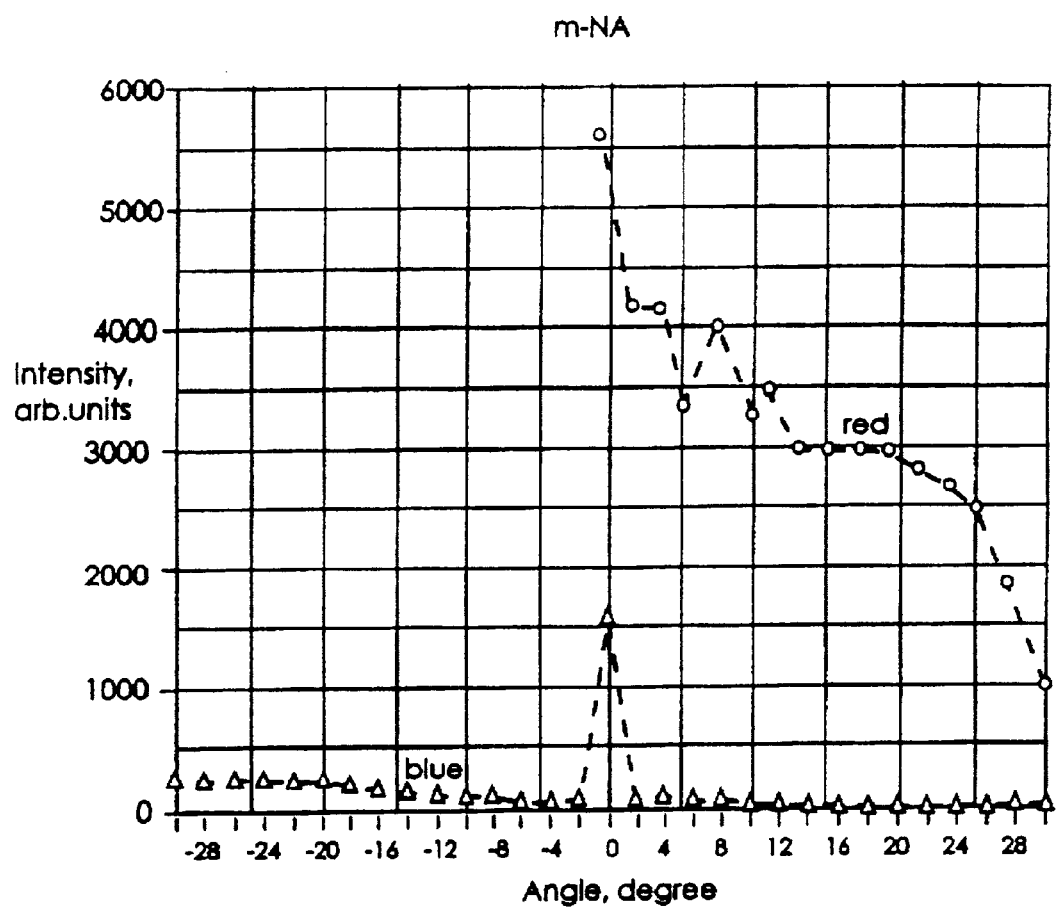
FIG. 10 shows the intensity of the second harmonic versus azimuthal ($\phi$, triangles) and tilting ($\theta$, circles) rotation angles. Crystal thickness is 1 $\mu$m. E is parallel to $n_\gamma$. $\phi_{max}=71°$, $\theta_{max}=6°$.
Figure 11:
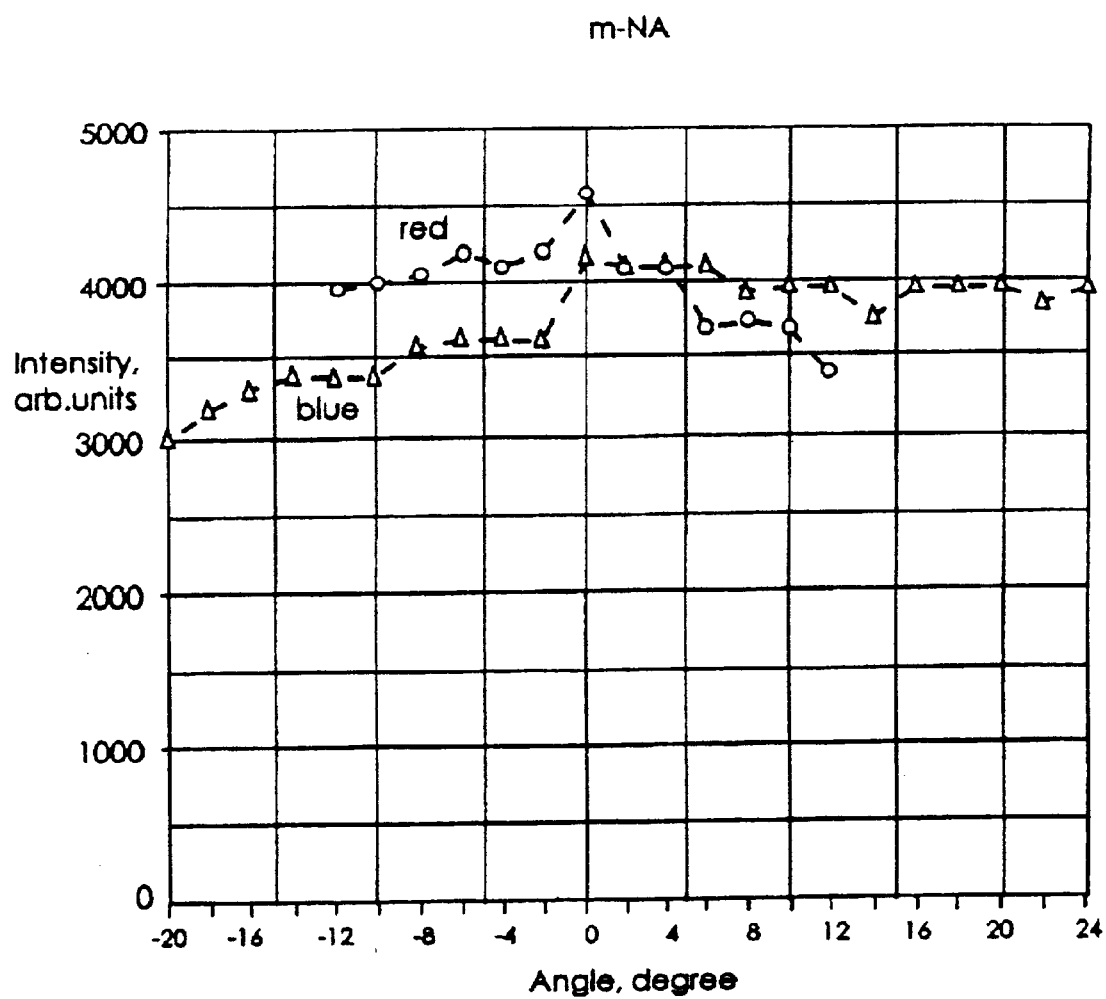
FIG. 11 shows the intensity of the second harmonic versus azimuthal ($\phi$, triangles) and tilting ($\theta$., circles) rotation angles. Crystal thickness is 2 $\mu$m. E is perpendicular to $n_\gamma$. $\phi_{max}=11°$, $\theta_{max}=38°$.
Figure 12:
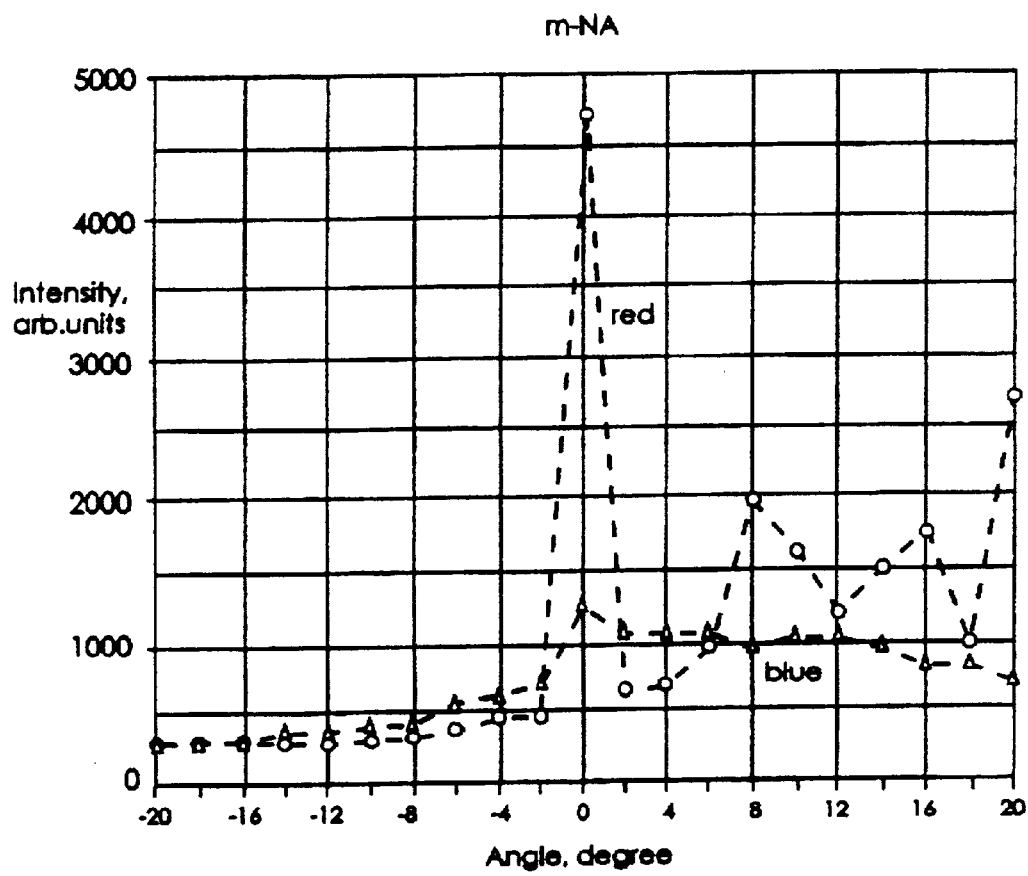
FIG. 12 shows the intensity of the second harmonic versus azimuthal ($\phi$, triangles) and tilting ($\theta$., circles) rotation angles. Crystal thickness is 2 $\mu$m. E is perpendicular to $n_\gamma$. $\phi_{max}=13°$, $\theta_{max}=52°$.

FIG. 9 shows the intensity of the second harmonic versus azimuthal (φ, triangles) and tilting (θ, circles) rotation angles. The crystal thickness is 1 μm. E is perpendicular to n$_\tau$. φ$_{max}$=70°, θ$_{max}$=50°. FIG. 10 shows the intensity of the second harmonic versus azimuthal (φ, triangles) and tilting (θ, circles) rotation angles. The crystal thickness is 1 μm. E is parallel to $n_\tau$. $\phi_{max}$=71°, $\theta_{max}$=6°. FIG. 11 shows the intensity of the second harmonic versus azimuthal (φ, triangles) and tilting (θ., circles) rotation angles. The crystal thickness is 2 μm. E is perpendicular to $n_\tau$. $\phi_{max}$=11°, $\theta_{max}$=38°. FIG. 12 shows the intensity of the second harmonic versus azimuthal (φ, triangles) and tilting (θ., circles) rotation angles. The crystal thickness is 2 μm. E is perpendicular to $n_\tau$. $\phi_{max}$=13°, $\theta_{max}$=52°.

Figure 13:
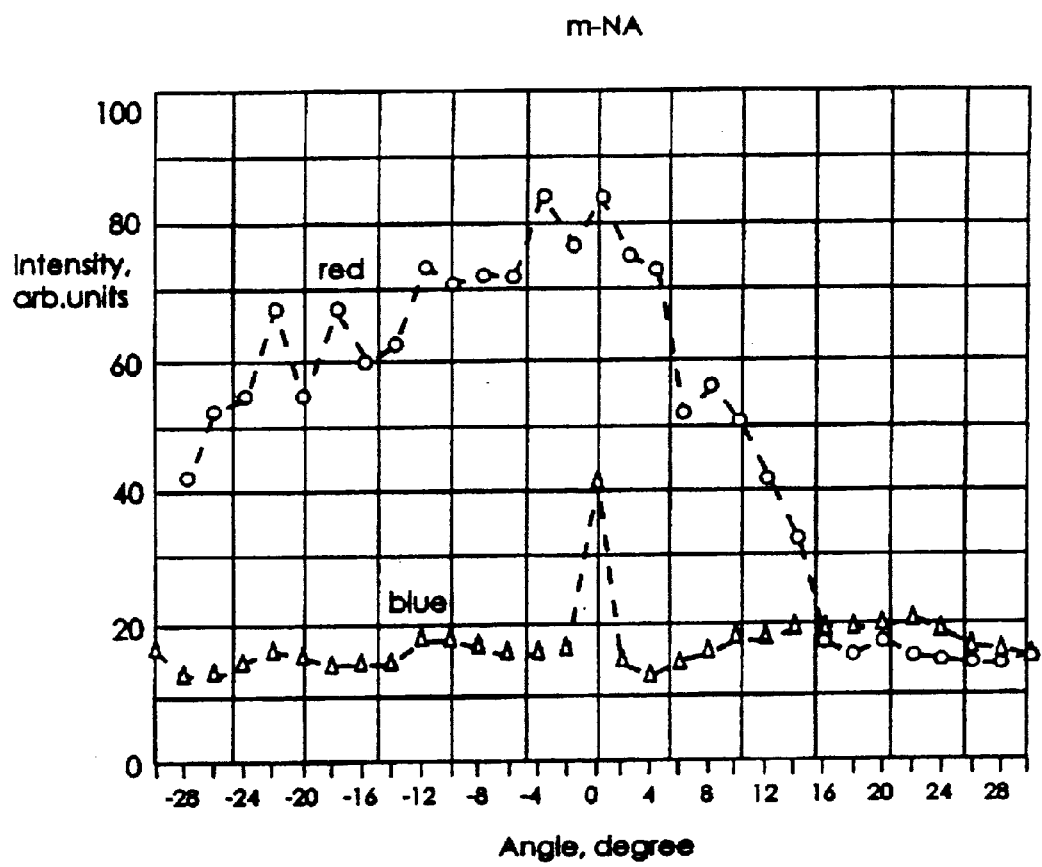
FIG. 13 shows the intensity of the second harmonic versus azimuthal ($\phi$, triangles) and tilting ($\theta$., circles) rotation angles. Crystal thickness is 5 $\mu$m. E is perpendicular to $n_\gamma$. $\phi_{max}=66°$, $\theta_{max}=20°$.
Figure 14:
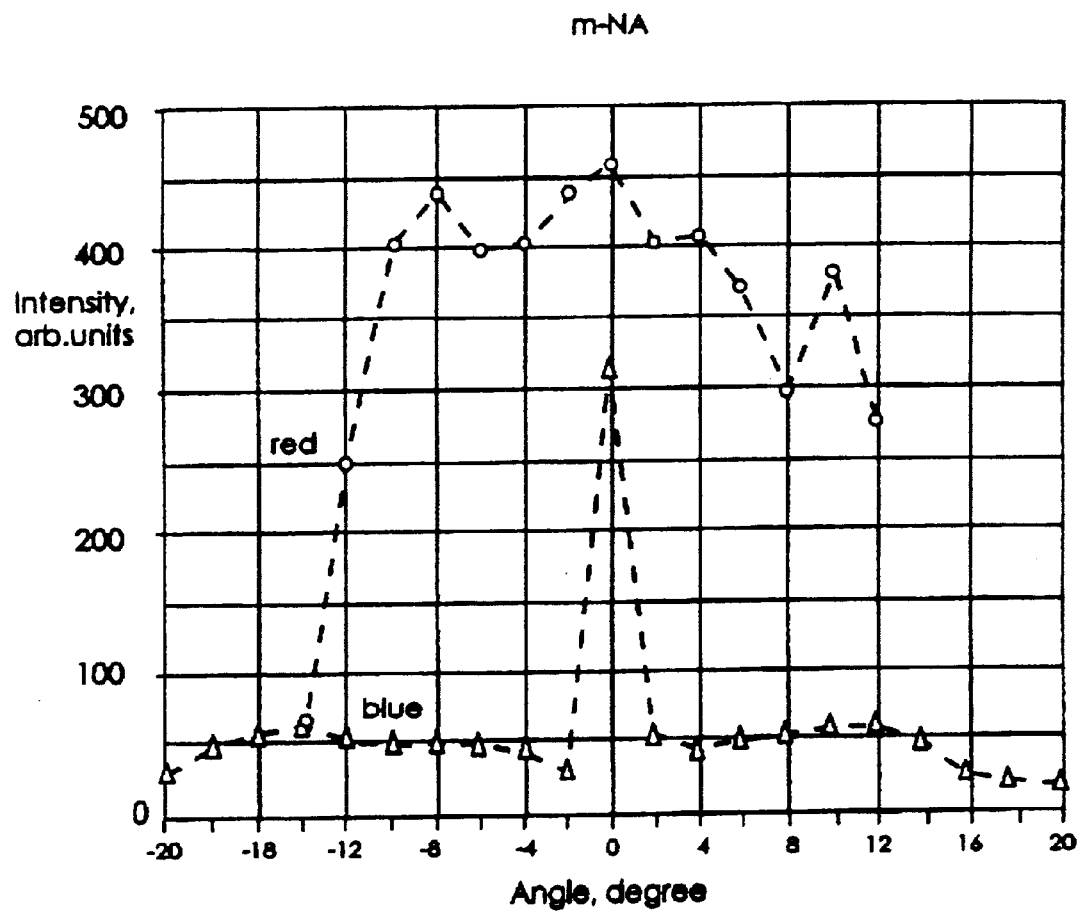
FIG. 14 shows the intensity of the second harmonic versus azimuthal ($\phi$, triangles) and tilting ($\theta$., circles) rotation angles. Crystal thickness is 5 $\mu$m. E is perpendicular to $n_\gamma$. $\phi_{max}=71°$, $\theta_{max}=5°$.

FIG. 13 shows the intensity of the second harmonic versus azimuthal (φ, triangles) and (θ., circles) rotation angles. The crystal thickness is 5 μm. E is perpendicular to $n_{96}$. $\phi_{max}$=66°, $\theta_{max}$=20°. FIG. 14 shows the intensity of the second harmonic versus azimuthal (φ, triangles) and tilting (θ., circles) rotation angles. The crystal thickness is 5 μm. E is perpendicular to $n_\tau$. $\phi_{max}$=71, $\theta_{mass}$=5°. FIG. 15 shows the intensity of the second harmonic versus azimuthal (φ, triangles) and tilting (θ., circles) rotation angles. The crystal thickness is 10 μm. E is perpendicular to $n_\tau$. $\phi_{max}$=9°, $\theta_{max}$=61°.

FIG. 16 shows the intensity of the second harmonic versus azimuthal (φ, triangles) and tilting (θ., circles) rotation angles. The crystal thickness is 10 μm. E is perpendicular to $n_\tau$. $\phi_{max}$=19°, $\theta_{max}$=40°. FIG. 17 shows the intensity of the second harmonic versus rotation angle along b-axis (parallel to $n_\alpha$). Crystal thickness=10 μm.

It is noted that there is a discrepancy between $\phi_{max}$ and $\theta_{max}$ values for different crystal thicknesses. These values almost coincide for the 1 μm and 5 μm crystal thicknesses, whereas for a thicker 10 μm crystal, the maximum of the second harmonic intensity is achieved along a direction almost in the $n_\tau n_\beta$-plane. It is possible that, for thin crystals (1 μm and 5 μm thick) whose optical path is less than the coherence length (at 1,064 μm varying in the range from $I_{32}$=16 to $I_{33}$=3.9 μm), the mechanism of the second harmonic generation is different from that in thicker crystals. Observations reveal that in thin crystals $\phi_{max}$ and $\phi_{max}$ values correspond to the light propagating in a cone with an angle X satisfying the Cerenkov condition:

$$\cos X = n_{eff}/n_c$$

In this equation, $n_{eff}$ and $n_c$, are the crystal and cell material indices of refraction, respectively. The $\phi_{max}$ and $\theta_{max}$ values for the thick crystal roughly correspond to those estimated for m-NA crystal from the Fresnel equation.

Zero along the horizontal axis indicates the direction along which the maximum of the second harmonic intensity was observed (the matching condition in the $n_\tau n_\alpha$-plane). This result is significant in defining the orientation of the crystal for the most efficient non-linear performance (i.e., the phase matching direction is to be looked for in the plane perpendicular to the cleavage plane).

Example 3

Preparation of an Electro-optical Device

An electro-optic device was prepared having two good transparent conductive layers coated on the surfaces of two parallel plates. The parallel plates were made of fused quartz. These conductive layers had good adhesion, and were formed from transparent conducting indium-tin-oxide (ITO).

The electro-optic device was made by depositing a layer of transparent conducting ITO having an approximate thickness of 240 nm onto the two plates by radio frequency (rf) magnetron sputtering of a pressed ITO target in a 5 mtorr argon atmosphere. The base pressure of the chamber was 5/10$^{-6}$ torr, and the rf power was 200 W. After deposition, gold wire leads were attached to the terminals of the plates with silver paste.

Example 4

Growth of mNA and COANP Crystals

The mNA and COANP crystals were grown as follows. A cell filled with mNA or COANP compound powder was put onto a hot plate, which was heated to the melting point of each compound, respectively. The cell was taken out from the plate after all air bubbles inside the melt were removed. The cell was sealed after the melt cooled down. Next, the cell was put onto a heat exchange chamber on a polarizing microscope, through which heated liquid passed.

The melting and re-crystallization rates of mNA and COANP depended on the ambient temperature significantly. At a primary trial, the temperature of the liquid was usually set at 119.5° C. for mNA and 75.5° C. for COANP. These values were higher than the melting points of the respective organic compounds.

Only one seed located in the middle of the cell was chosen for each film growth trial. The shape of the mNA seed crystal was arrow-like, while the COANP one was an equilateral triangle. High quality COANP single crystal films were of the same triangular form, but they grew slowly. For example, it took 48 hours to grow a COANP single crystal film with a side length of 5 mm.

Using the techniques disclosed herein, crystals with thicknesses of from approximately 1 μm up to 20 μm were obtained.

Example 5

Characterization of mNA and COANP Crystalline Films

Figure 18:
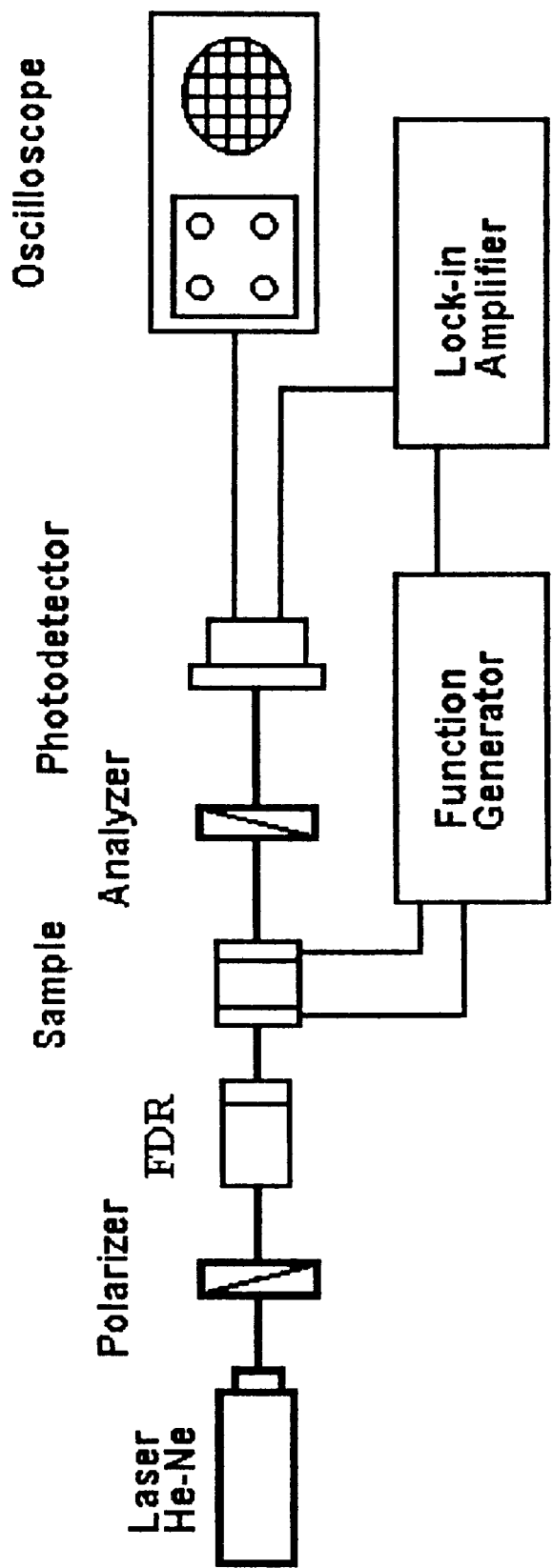
FIG. 18 shows an electro-optic measuring device according to the invention.

The electro-optic effects were characterized using an ac modulation method which is similar to, but more practical than that used by Yoshimura (*J. Appl. Phys.* 62:2028, 1987). The method is based on that disclosed by Lederman and Cui, *Optics Letters* 23(12): 909–911, 1998; Leyderman and Cui, *Proceedings of SPIE: Second-Order Organic Nonlinear Optics* 3474:84–93, 1998; Wu et al., *Proceedings of SPIE: Applications of Photonic Technology* 3 3491:694–699, 1998; and Leyderman et al., *J. Phys. D. Appl. Phys.* 31:2711–2717, 1998. The experimental setup for the electro-optic measurement is shown in FIG. 18. A 632 nm He-Ne laser with 2 mW was employed as the light source. Two Glan-Thompson polarizers were used as a polarizer and an analyzer, and a Fresnel double rhomb (FDR) was used to rotate the plane of polarization. After passing through the polarizer and the FDR, the light beam, which was incident upon the cell, then passed through the analyzer, and was finally detected by a silicon photo detector. The dc beam intensity was monitored by an oscilloscope. A sinusoidal-modulated voltage with a frequency of 1 kHz and amplitude up to 9 V was applied to the quartz plates from a function generator. Pockels effect was detected when the output signal was sent to a lock-in amplifier and compared with the reference signal at 1 kHz, while the Kerr effect was detected at 2 kHz.

It was found that the cleavage plane of the thin crystalline film grown between the two plates coincided with the planes of the plates. Thus, the refractive axis $n_x$ of COANP and the refractive axis $n_y$ of mNA, and the external electric field E were parallel to the crystallography a(b)-axis and perpendicular to the as-grown plate. However, if the beam incidented perpendicularly on the plate, analysis revealed that the Pockels effect could not be detected.

The change of electro-optic phase retardation was measured with the ac modulation method. The absorption and reflection of the beam by the sample and the cell were neglected. The polarizer was usually set at 0° polarizer direction.

Both Pockels and the Kerr effect in the cells were examined. A driving voltage, both dc and ac, was applied to the crystal through two ITO electrodes. The dc bias was usually set at 0 for linear electro-optic measurements, i.e., the Pockels effect, because there was no significant change when the dc bias changed from 0 to a few volts. However, the quadratic electro-optic effect, i.e., the Kerr effect, depended greatly on dc voltage.

It should be noted that, if the electrical component of the light need not be changed, the FDR could be removed from the measurement system. Some representative results of electro-optic measurements of an mNA cell are demonstrated below. The mNA crystal thickness was 10 $\mu$m. The polarizer and the analyzer were set at 0° and 90°, respectively. Without application of an external field, the output signal was the dc signal. However, when the ac voltage was increasedfrom 0 to 9 V with an interval of 0.5 V, then reversed, the output light was modified correspondingly, and small ac signals were added to the dc signal.

Figure 19:
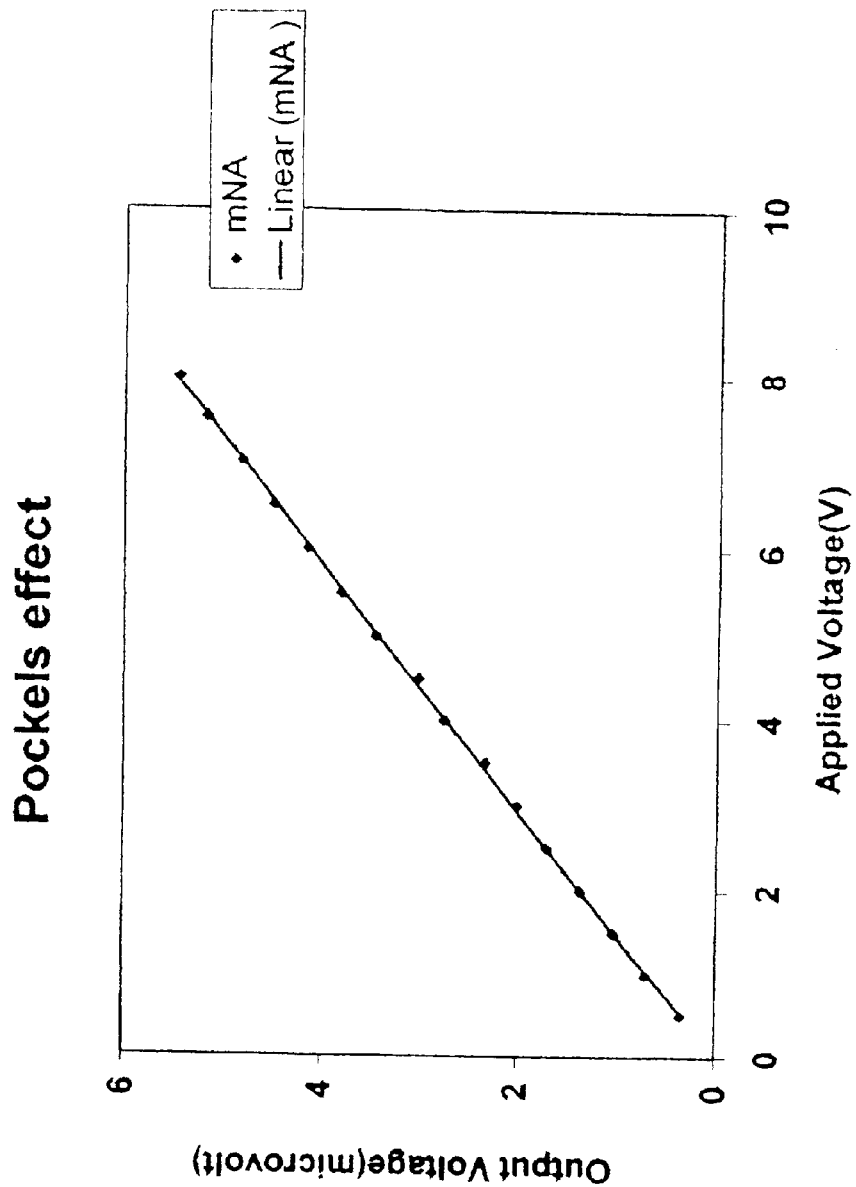
FIG. 19 shows the observed modulated intensity of the light plotted as a function of the amplitude of ac voltage, with respect to an mNA crystal film.

FIG. 19 shows the observed modulated intensity of the light plotted as a function of the amplitude of ac voltage. The frequency of the signal was the same as that of applied ac voltage. The solid line was the least-squares fit to the data points. It can be seen clearly that the output intensity depended on the applied voltage linearly, which ensured that the observed electro-optic signal was due to the Pockels effect.

Figure 20:
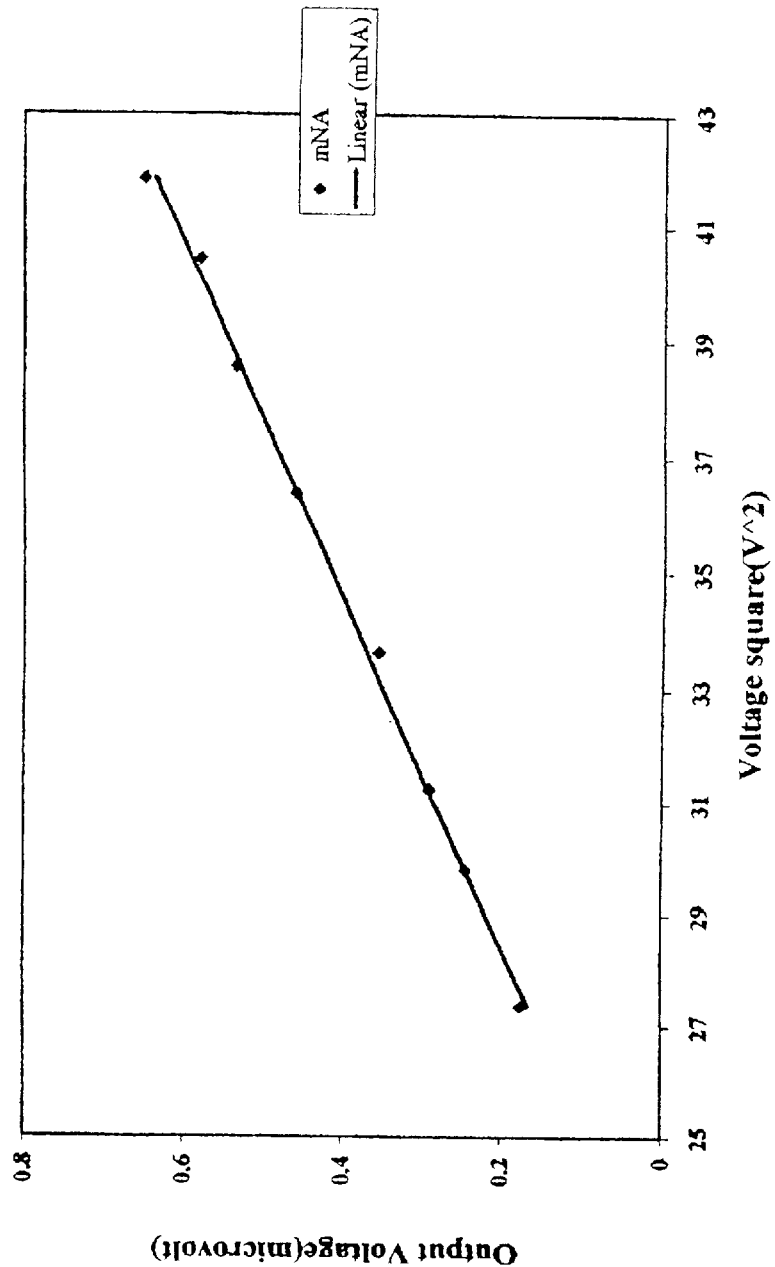
FIG. 20 is a plot of modulated intensity vs. the square of the applied voltages, with respect to an mNA crystal film.

FIG. 20 is a plot of modulated intensity vs. the square of the applied voltages. Here, dc bias was set at 8 V, and the signal was measured at the double frequency of that driving ac voltage. A linear dependence of the output intensity on the quadratic applied voltage ensures that the electro-optic signals come from the Kerr effect. Comparing this figure with FIG. 19, at the same modulation voltage, one finds that the Kerr signal is one order less than the Pockels signal.

Figure 21:
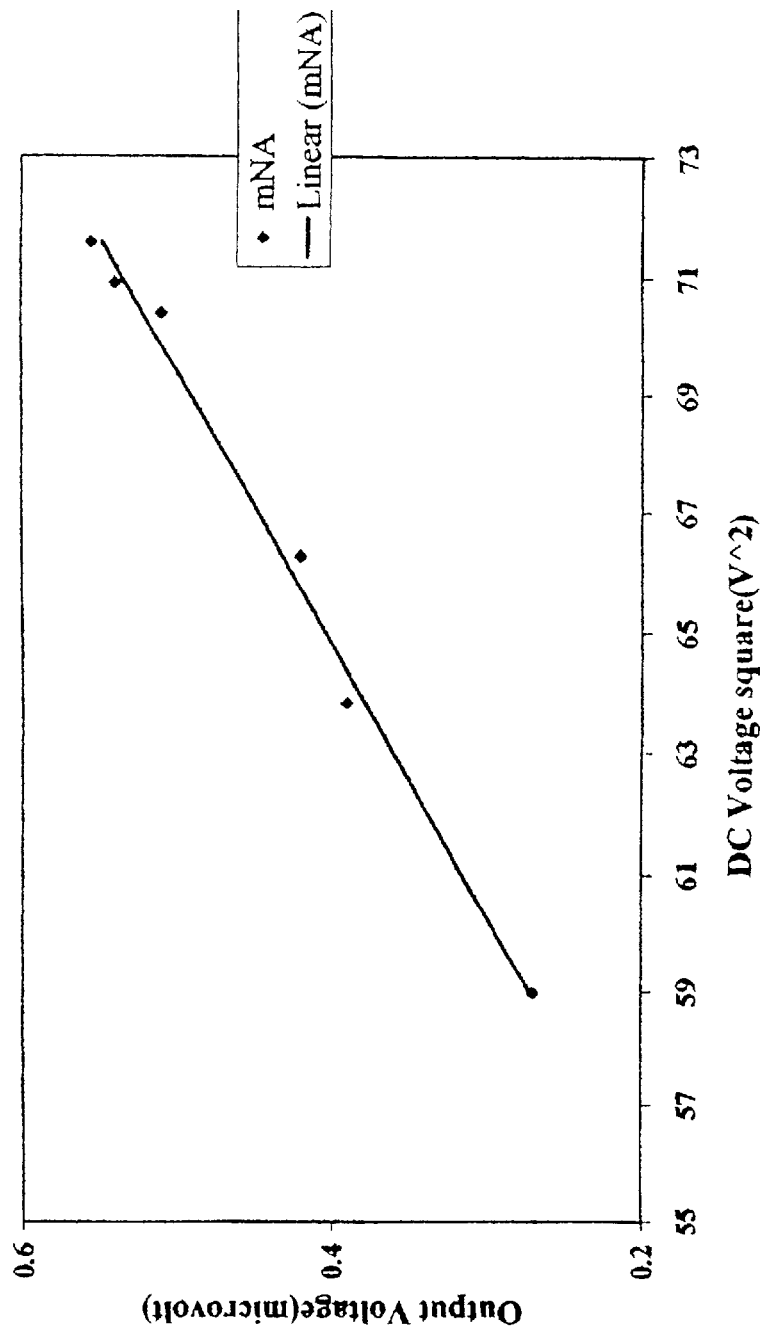
FIG. 21 shows the effect of dc bias on the Kerr effect for an mNA crystalline film.

The effect of dc bias on the Kerr effect is given in FIG. 21. Here, the ac voltage was set at 5 V. It can be seen that the dependence of the output voltage on the dc voltage square is linear.

Figure 22:
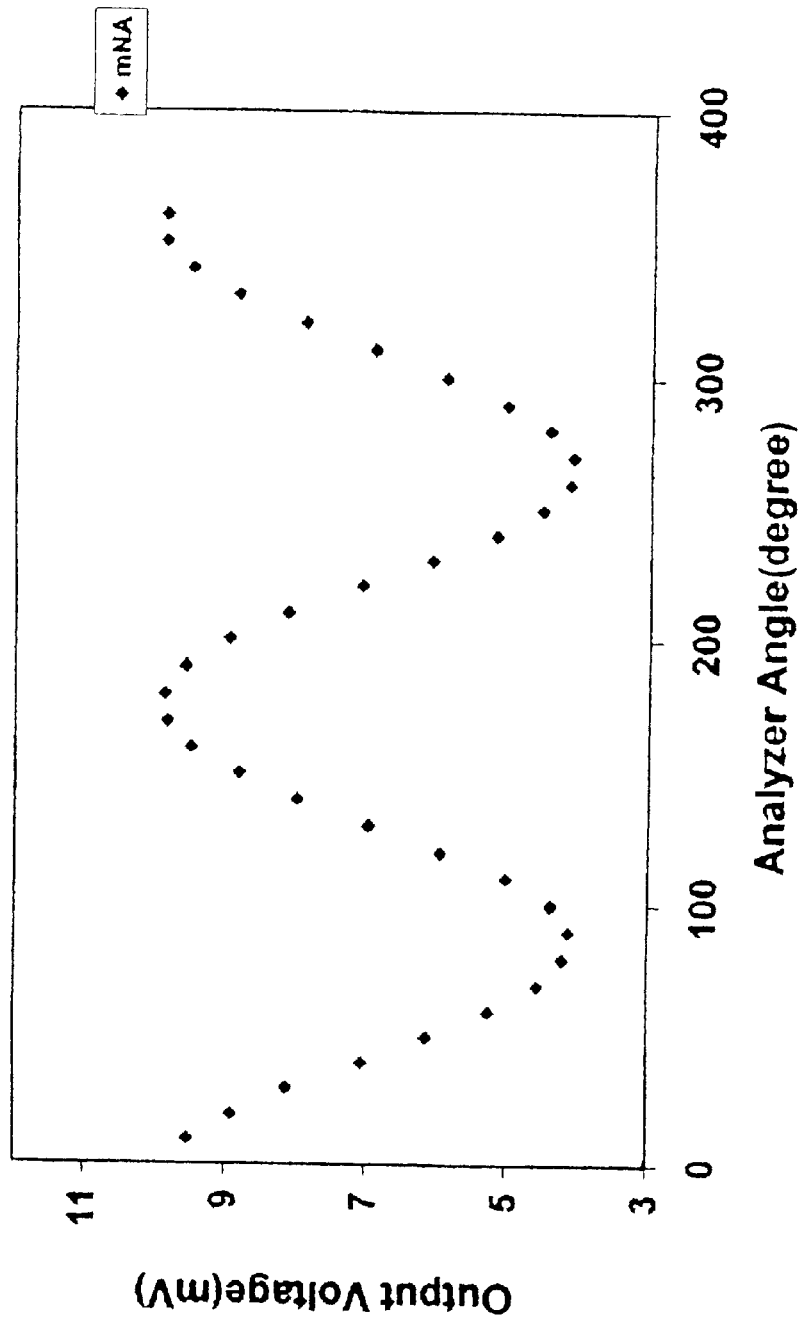
FIG. 22 shows a typical plot of dc signals of 10 $\mu$m thick mNA crystals measured by oscilloscope as a function of analyzer angle.
Figure 23:
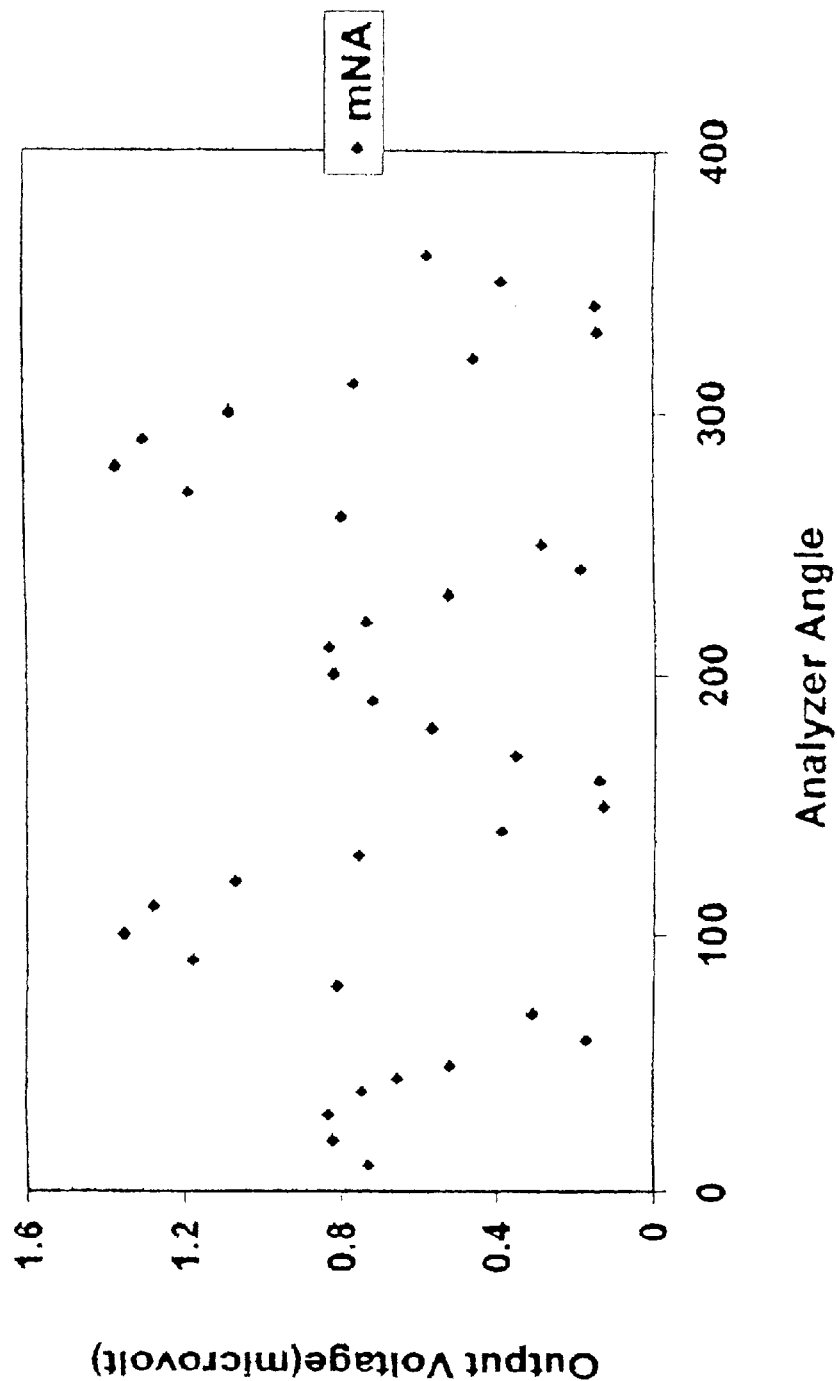
FIG. 23 shows the signals measured as a function of $\theta_a$ of the mNA cell with application of a 5 V modulation voltage.

FIG. 22 gives a typical plot of dc signals of 10 $\mu$m thick mNA crystals measured by oscilloscope as a function of analyzer angle. The FDR was not introduced, and the polarizer was set at 45°. It can be seen that the graph is a regular sinusoidal function. The angles $\alpha$ and $\delta_0$ were estimated to be 12° and 83°, respectively. The signals measured as a function of $\theta_a$ of the mNA cell with application of a 5 V modulation voltage are given in FIG. 23. The ac signals were positive since lock-in amplifier always measured a positive amplitude of a signal irrespective of its phase. The graph is not a regular sinusoidal function as anticipated. From the maximum value of the ac signal, the phase retardation $\Delta\delta$ and the figure of merit of electro-optic phase retardation F were estimated to be $1.6\times10^{-4}$ and $3.2\times10^{-2}$, respectively.

Figure 24:
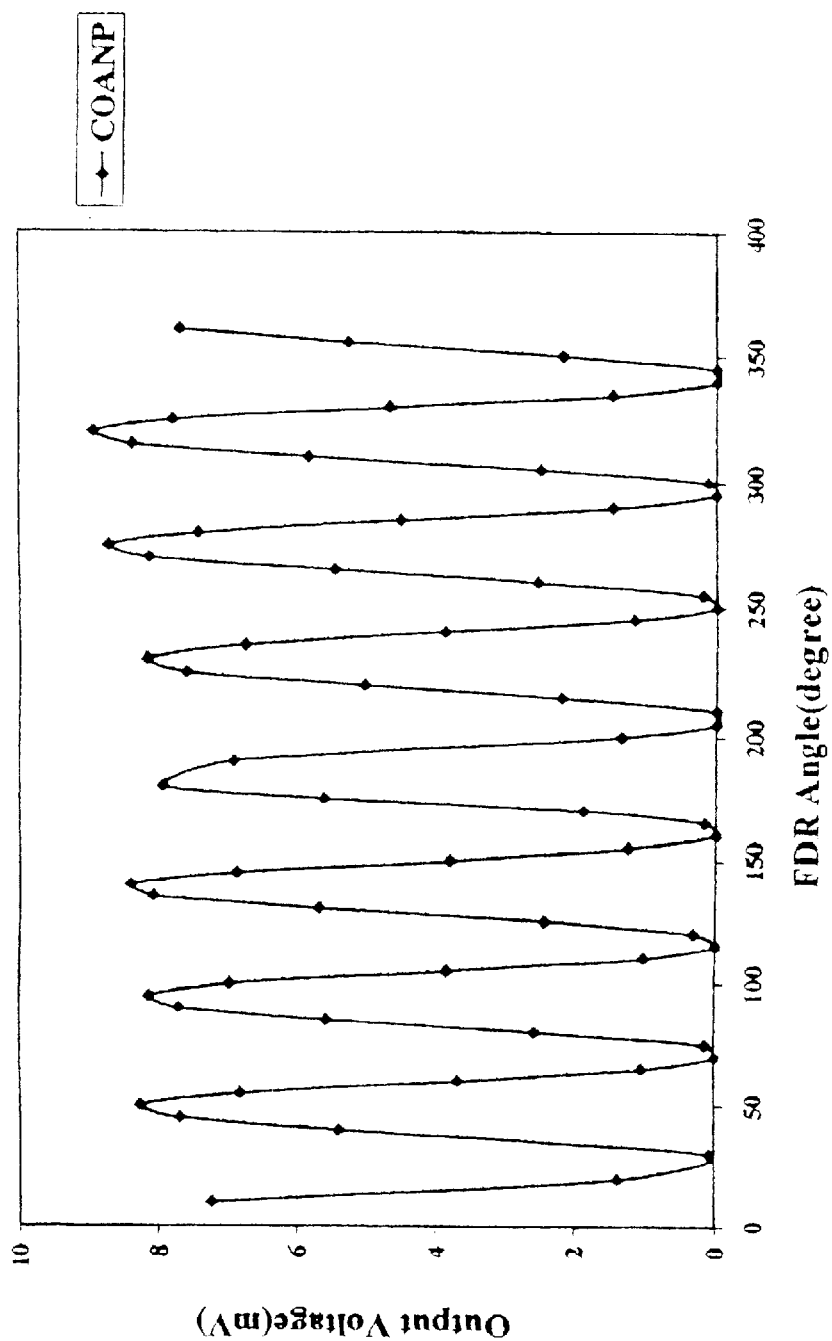
FIGS. 24 and 25 show the intensity of the signals of a 20 $\mu$m thick COANP crystal as a function of the FDR angle $\theta_{FDR}$.
Figure 25:
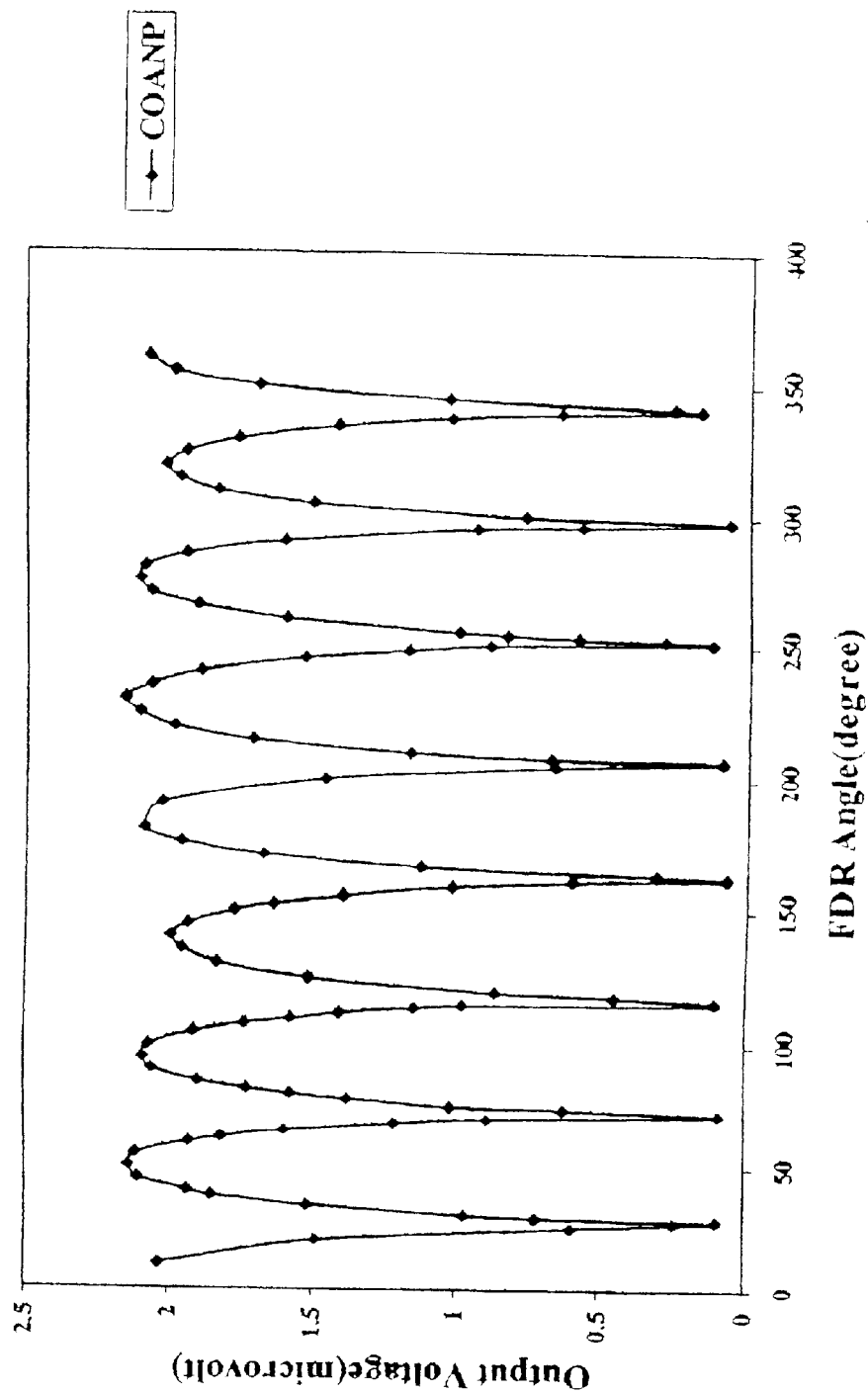

FIGS. 24 and 25 give the intensity of the signals of a 20 $\mu$m thick COANP crystal as a function of the FDR angle OFDR. The ac voltage was set at 6 V and the analyzer was perpendicular to the direction of electric component of the light by adjusting $\theta_a$. The angle $\alpha$ was determined to be 37°.

Figure 26:
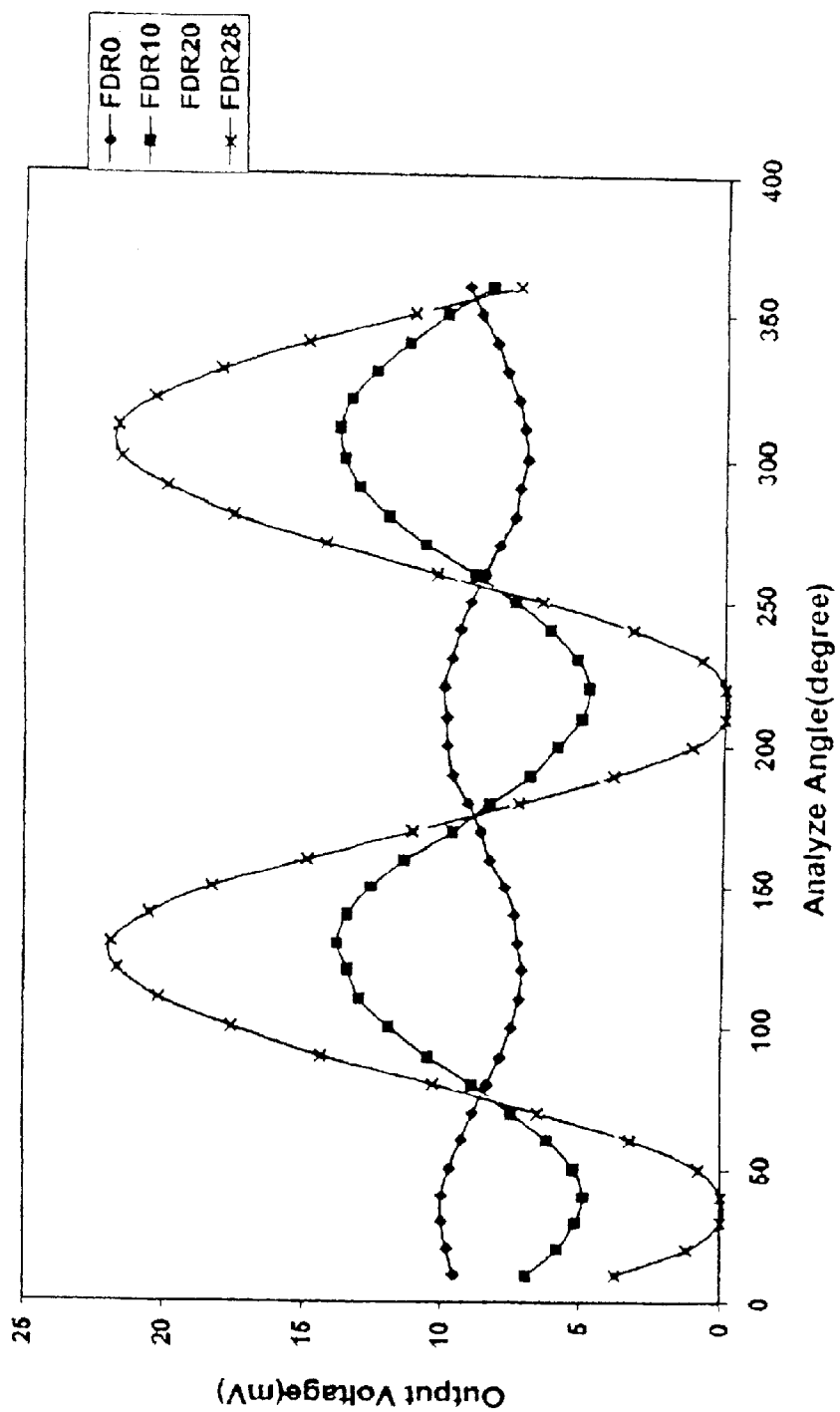
FIG. 26 shows dc signals of the 20 $\mu$m thick COANP crystal measured as a function of analyzer angle at 0°, 10°, 20°, and 27.5° FDR angles.

FIG. 26 gives dc signals of the 20 $\mu$m thick COANP crystal measured as a function of analyzer angle at 0°, 10°, 20°, and 27.5° FDR angles. It was found that the dc signals, as a function of the analyzer angle, were sinusoidal. The angle $\delta_0$ was 87°. The shapes of the ac signals as a function of the analyzer angle were not identical, and they depended heavily on $O_{FDR}$.

Figure 27:
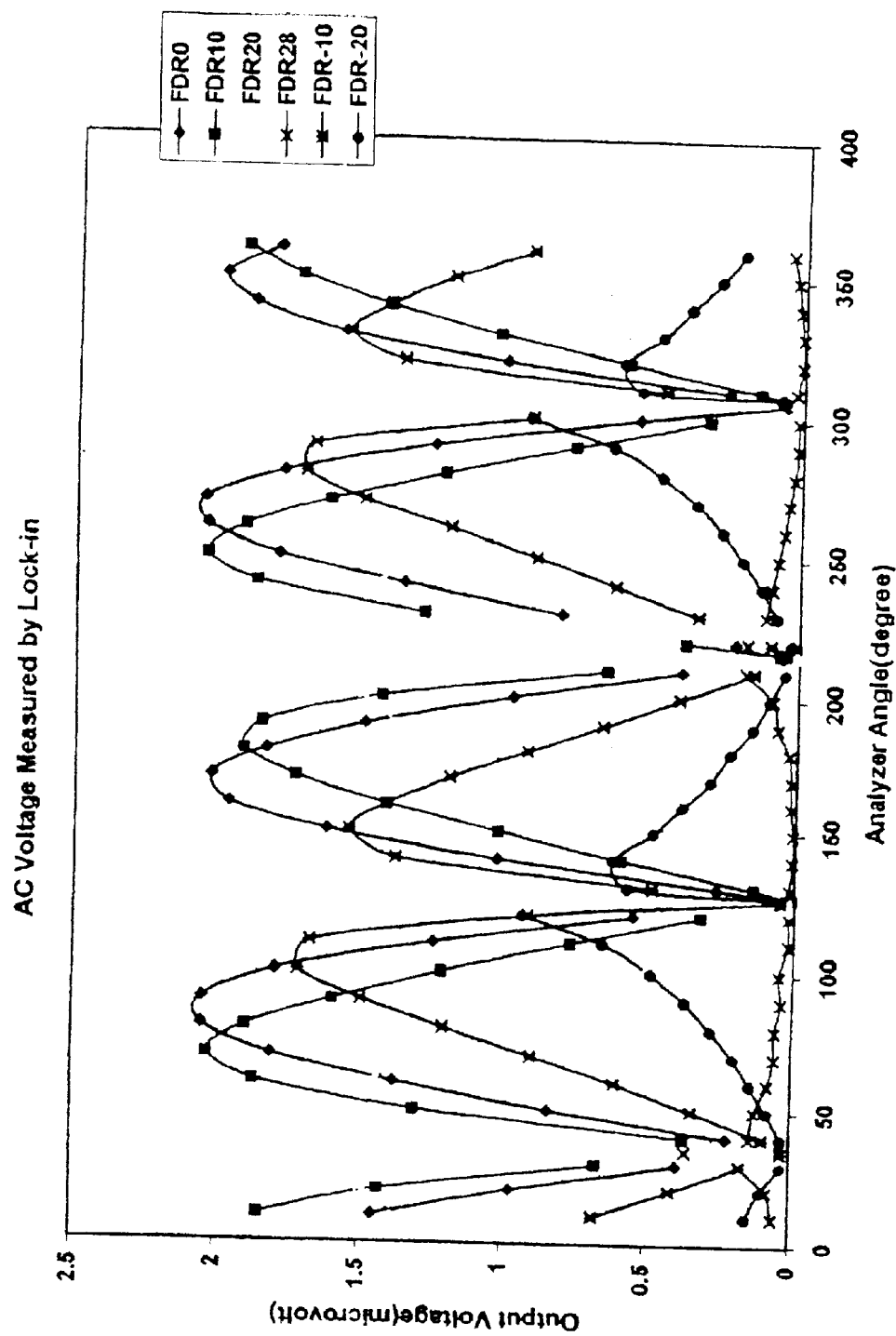
FIG. 27 shows ac signals of the 20 $\mu$m thick COANP crystal measured as a function of the analyzer angle at different FDR angles.

FIG. 27 gives ac signals of the 20 $\mu$m thick COANP crystal measured as a function of the analyzer angle at different FDR angles. It was found that the curve of the 0° FDR angle was a standard sinusoidal curve. The data for other FDR angles were not fitted by a simple periodic function. The smaller the angle of the FDR, the closer the shapes of the curves to the sinusoidal function. However, all these curves had the same zero-points, confirming that $\alpha=-37°$. The ratio of the amplitudes of the curves was proportional to $\sin(4\theta_{FDR}-2\alpha)$. The phase retardation $\Delta\delta$ was given as $2.5\times10^{-4}$, and the figure of merit of electro-optic phase retardation F was estimated as $4.2\times10^{-12}$ m/V. Because the figures of merit of crystals did not change significantly over a period of a few months, it was concluded that both mNA and COANP crystals were protected by the cells. Crystals and crystalline films fabricated from other organic compounds are expected to act similarly. Many modifications and other embodiments of the invention will come to one skilled in the art having the benefit of the teachings presented in the foregoing descriptions and the associated drawings. Therefore, it is to be understood that the invention is not to be limited to the specific embodiments disclosed, and that modifications are intended to be included within the scope of the appended claims. All of the references cited herein are hereby incorporated in their entirety by reference.

What is claimed is:

1. An organic monocrystal, wherein said crystal has a figure of merit of electro-optic phase retardation between approximately $1\times10^{-12}$ m/V and approximately $9.9\times10^{-12}$ m/V.

2. The organic crystal of claim 1, wherein said crystal has a figure of merit between approximately $3.2\times10^{-12}$ m/V and approximately $4.2\times10^{-12}$ m/V.

3. The organic crystal of claim 1, wherein said crystal comprises meta-nitroaniline, 2-methyl-4-nitroaniline(-)2-(alpha-methyibenzylamino)-5-nitropyridine, N-(4-nitrophanyl)-L-prolinol, benzyl, 2-cyclo-octylamino-5-nitropyridine,2-[N prolinol]-5-nitropyridine (PNP), or 2-adamanlylamino-5-nitropyridine.

4. The organic crystal of claim 3, wherein said crystal comprises meta-nitroaniline.

5. The organic crystal of claim 4, wherein said crystal has a figure of merit between approximately $1.6\times10^{-12}$ m/V and approximately $5.6\times10^{-12}$ m/V.

6. The organic crystal of claim 5, wherein said figure of merit is approximately $3.2\times10^{-12}$ m/V.

7. The organic crystal of claim 3, wherein said crystal comprises 2-methyl-4-nitroaniline.

8. The organic crystal of claim 3, wherein said crystal comprises (-)2-(alpha-methylbenzylamino)-5-nitropyridine.

9. The organic crystal of claim 3, wherein said crystal comprises N-(4-nitrophenyl)-L-prolinol.

10. The organic crystal of claim 3, wherein said crystal comprises 2-cyclo-octylamino-5-nitropyridine.

11. The organic crystal of claim 10, wherein said crystal has a figure of merit between approximately $3.7\times10^{-12}$ m/V and approximately $4.7\times10^{-12}$ m/V.

12. The organic crystal of claim 11, wherein said figure of merit is approximately $4.2 \times 10^{-12}$ m/V.

13. The organic crystal of claim 3, wherein said crystal comprises benzyl.

14. The organic crystal of claim 3, wherein said crystal comprises 2-[N-prolinol]-5-nitropyridine.

15. The organic crystal of claim 3, wherein said crystal comprises 2-adamanlylamino-55-nitropyridine.

16. An organic monocrystalline film comprising the crystal of claim 1.

17. The organic monocrystalline film of claim 16, wherein said film has a thickness of less than 20 μm.

18. The organic monocrystalline film of claim 17, wherein said film has a thickness of less than 3 μm.

19. The organic crystal of claim 1, wherein said crystal has a thickness of less than 20 μm.

20. The organic crystal of claim 1, wherein said crystal has a thickness of less than 3 μm.

* * * * *